(12) United States Patent
Johnson

(10) Patent No.: US 9,901,204 B1
(45) Date of Patent: Feb. 27, 2018

(54) DRINK COASTER FOLDABLE INTO STAND

(71) Applicant: REVOLUTION MARKETING, LLC, Edina, MN (US)

(72) Inventor: Christopher Johnson, Edina, MN (US)

(73) Assignee: Revolution Marketing, LLC, Edina, MN (US)

( * ) Notice: Subject to any disclaimer, the term of this patent is extended or adjusted under 35 U.S.C. 154(b) by 0 days.

(21) Appl. No.: 15/428,377

(22) Filed: Feb. 9, 2017

(51) Int. Cl.
| A47B 91/00 | (2006.01) |
| A47G 23/03 | (2006.01) |
| A47G 23/032 | (2006.01) |
| F16M 11/38 | (2006.01) |
| H05K 5/00 | (2006.01) |
| H05K 5/02 | (2006.01) |

(52) U.S. Cl.
CPC ....... *A47G 23/0306* (2013.01); *A47G 23/032* (2013.01); *F16M 11/38* (2013.01); *H05K 5/0086* (2013.01); *H05K 5/0204* (2013.01)

(58) Field of Classification Search
CPC .... A47B 23/044; B65D 31/142; G06F 1/1626
See application file for complete search history.

(56) References Cited

U.S. PATENT DOCUMENTS

| 2,444,891 | A  * | 7/1948  | Johnsson | B65D 31/142 383/46 |
| 8,282,065 | B1 * | 10/2012 | Stone    | A47B 23/044 16/221 |
| 8,424,829 | B2   | 4/2013  | Lu et al. | |
| 9,326,638 | B2   | 5/2016  | Kelsey   | |
| 2013/0075280 | A1 * | 3/2013 | Besner  | G06F 1/1626 206/45.23 |

FOREIGN PATENT DOCUMENTS

WO  1995011610 A1  5/1995

* cited by examiner

*Primary Examiner* — Amy Sterling
(74) *Attorney, Agent, or Firm* — Seager, Tufte & Wickhem LLP

(57) ABSTRACT

A drink coaster configured to be converted into a stand. The drink coaster includes a flat sheet of material including a first preferential fold line extending across the flat sheet of material between a first panel of the flat sheet of material and a second panel of the flat sheet of material, and a second preferential fold line extending across the flat sheet of material between the second panel of the flat sheet of material and a third panel of the flat sheet of material. The flat sheet of material is configured to be folded along the first preferential fold line and along the second preferential fold line to convert the drink coaster into a stand for an electronic device.

20 Claims, 32 Drawing Sheets

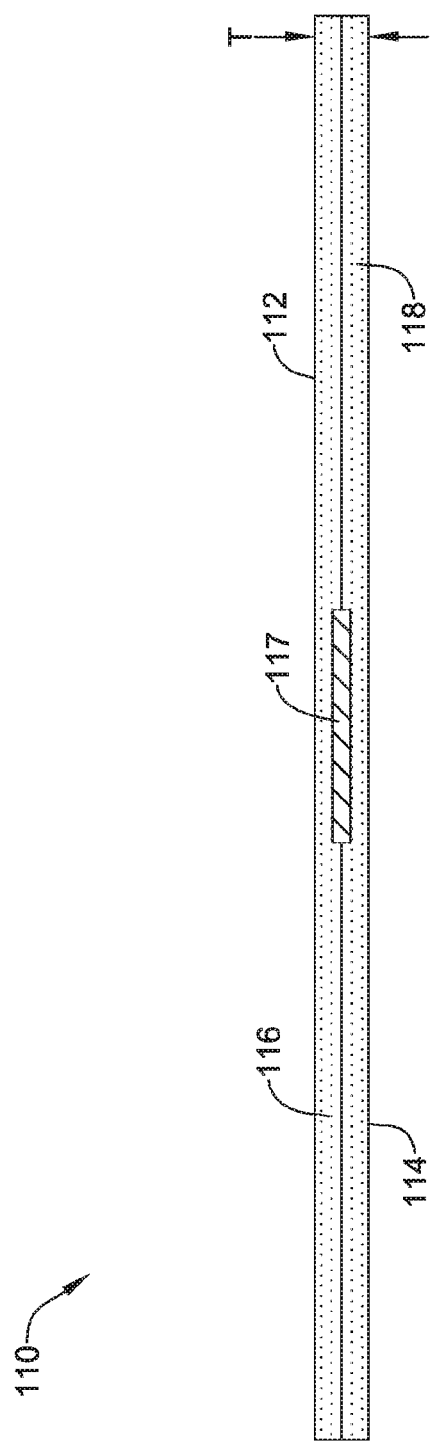

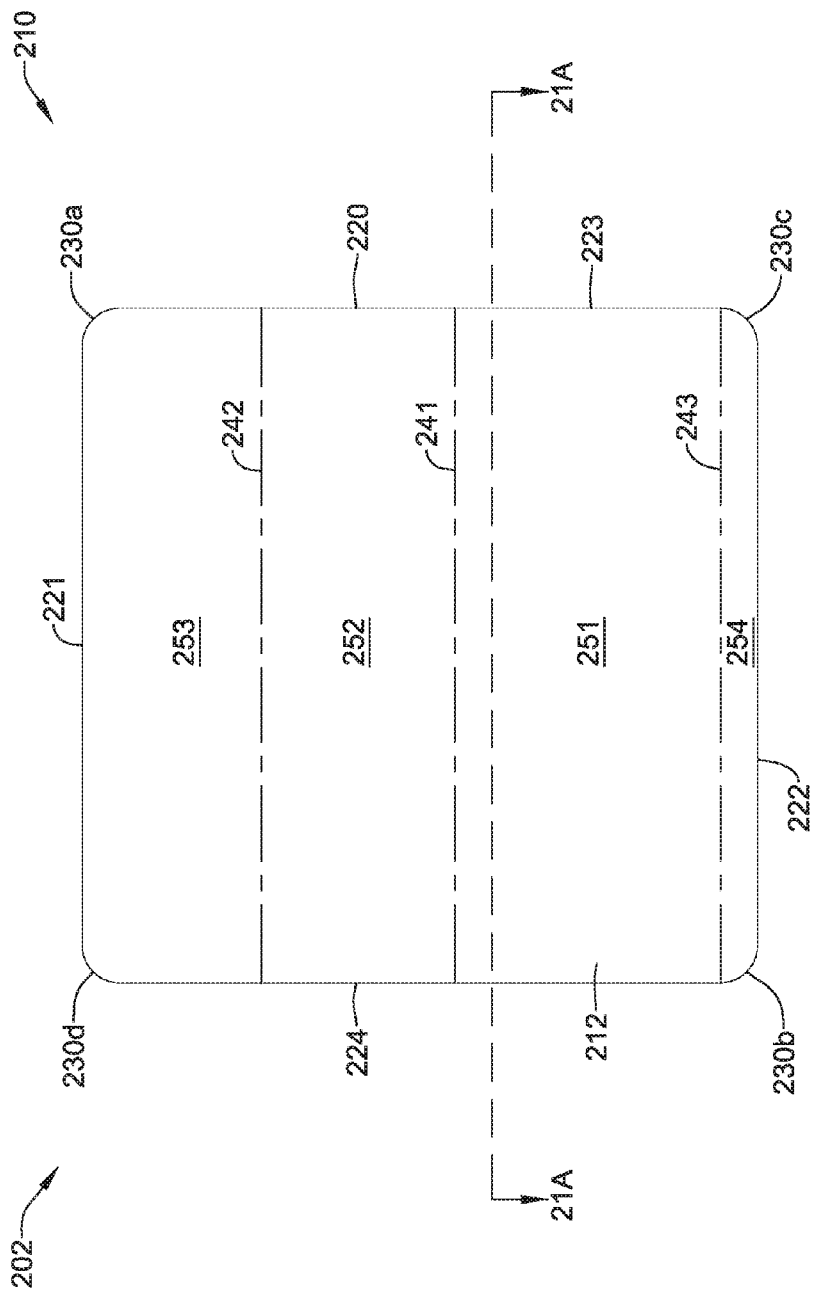

DRINK COASTER FOLDABLE INTO STAND

TECHNICAL FIELD

The present disclosure pertains to drink coasters configured to be folded into a stand. More particularly, the present disclosure pertains drink coasters including one or more preferential fold lines for permitting the coaster to be folded into a stand for an item, such as an electronic device.

BACKGROUND

While sitting or standing at a table, bar, counter, or other flat surface, a user may find it desirable to prop up his/her electronic device in an inclined position for better viewing of the screen and/or accessibility. Accordingly, it may be desirable to provide a drink coaster that can be conveniently folded into a stand for propping up the electronic device in an inclined position.

BRIEF SUMMARY

This disclosure provides designs, materials, manufacturing methods, and uses for drink coasters configured to be converted into a stand for an item.

A first example includes a drink coaster configured to be converted into a stand. The drink coaster includes a flat sheet of material having an upper surface, an opposite lower surface, and a peripheral edge extending around a periphery of the flat sheet of material and extending from the upper surface to the lower surface. The drink coaster also includes a first preferential fold line and a second preferential fold line. The first preferential fold line extends across the flat sheet of material between a first panel of the flat sheet of material and a second panel of the flat sheet of material. The second preferential fold line extends across the flat sheet of material between the second panel of the flat sheet of material and a third panel of the flat sheet of material. The flat sheet of material is configured to be folded along the first preferential fold line such that the second panel extends at an acute angle from the first panel and the flat sheet of material is configured to be folded along the second preferential fold line such that the third panel extends at an angle from the second panel toward the first panel.

Alternatively or additionally to any of the examples above, in another example, the first preferential fold line extends parallel to the second preferential fold line.

Alternatively or additionally to any of the examples above, in another example, the first preferential fold line includes a score line or perforation extending along the lower surface of the flat sheet of material.

Alternatively or additionally to any of the examples above, in another example, the second preferential fold line includes a score line or perforation extending along the lower surface of the flat sheet of material.

Alternatively or additionally to any of the examples above, in another example, the peripheral edge of the flat sheet of material includes a first edge, a second edge parallel to the first edge, a third edge perpendicular to the first and second edges, and a fourth edge parallel to the third edge.

Alternatively or additionally to any of the examples above, in another example, the peripheral edge of the flat sheet of material includes first second, third and fourth planar edges, wherein the first and third planar edges converge at a first rounded corner and the second and fourth planar edges converge at a second rounded corner.

Alternatively or additionally to any of the examples above, in another example, the first preferential fold line extends from the first rounded corner to the second rounded corner.

Alternatively or additionally to any of the examples above, in another example, the peripheral edge of the flat sheet of material extends circumferentially around a center of the flat sheet.

Alternatively or additionally to any of the examples above, in another example, the first preferential fold line bisects one of the upper or lower surface.

Alternatively or additionally to any of the examples above, in another example, the first panel has a larger surface area than the second panel, and the second panel has a larger surface area than the third panel.

Alternatively or additionally to any of the examples above, in another example, a third preferential fold line extends across the flat sheet of material between the first panel of the flat sheet of material and a fourth panel of the flat sheet of material.

Alternatively or additionally to any of the examples above, in another example, the first preferential fold line extends parallel to the second preferential fold line and the first preferential fold line extends parallel to the third preferential fold line.

Alternatively or additionally to any of the examples above, in another example, the first panel has a larger surface area than the second panel, the second panel has a larger surface area than the third panel, and the third panel has a larger surface are than the fourth panel.

Alternatively or additionally to any of the examples above, in another example, the flat sheet of material includes a plastically deformable insert configured to retain a folded shape of the drink coaster.

Alternatively or additionally to any of the examples above, in another example, the plastically deformable insert is a metallic layer interposed between a first paperboard layer and a second paperboard layer of the flat sheet of material.

Alternatively or additionally to any of the examples above, in another example, the plastically deformable insert is a metallic band extending across the first and second preferential fold lines perpendicular to the first and second preferential fold lines.

Another example includes a drink coaster configured to be converted into a stand. The drink coaster includes a flat sheet of material having an upper surface, an opposite lower surface, and a peripheral edge extending around a periphery of the flat sheet of material and extending from the upper surface to the lower surface. The also includes a first preferential fold line and a second preferential fold line. The first preferential fold line extends across the flat sheet of material between a first panel of the flat sheet of material and a second panel of the flat sheet of material. The second preferential fold line extends across the flat sheet of material between the second panel of the flat sheet of material and a third panel of the flat sheet of material. The flat sheet of material is configured to be folded into a folded configuration for providing a stand. In the folded configuration, the first panel is configured to be positioned on a flat surface, the second panel extends from the first preferential fold line at an acute angle from the first panel, and the third panel extends from the second preferential fold line at an angle from the second panel toward the first panel.

Alternatively or additionally to any of the examples above, in another example, the first preferential fold line extends parallel to the second preferential fold line.

Alternatively or additionally to any of the examples above, in another example, a third preferential fold line extends across the flat sheet of material between the first panel of the flat sheet of material and a fourth panel of the flat sheet of material.

Alternatively or additionally to any of the examples above, in another example, in the folded configuration the fourth panel extends from the third preferential fold line at an acute angle from the first panel.

The above summary of some embodiments is not intended to describe each disclosed embodiment or every implementation of the present disclosure. The Figures, and Detailed Description, which follow, more particularly exemplify some of these embodiments.

BRIEF DESCRIPTION OF THE DRAWINGS

The disclosure may be more completely understood in consideration of the following detailed description in connection with the accompanying drawings, in which:

FIG. 12A is a cross-sectional view of the drink coaster of FIG. 12 taken along line 12A-12A;
FIG. 21 is a top view of an exemplary drink coaster.

Figure 1:
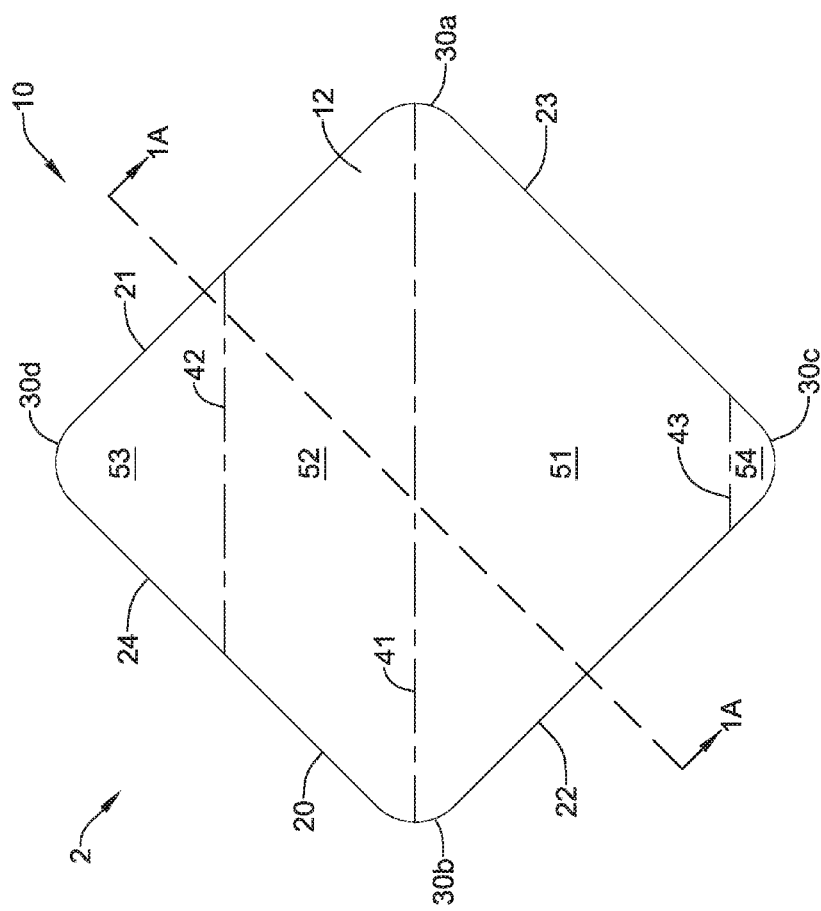
FIG. 1 is a top view of an exemplary drink coaster.

While the disclosure is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the disclosure.

DETAILED DESCRIPTION

For the following defined terms, these definitions shall be applied, unless a different definition is given in the claims or elsewhere in this specification.

All numeric values are herein assumed to be modified by the term "about," whether or not explicitly indicated. The term "about" generally refers to a range of numbers that one of skill in the art would consider equivalent to the recited value (i.e., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include one or more particular features, structures, and/or characteristics. However, such recitations do not necessarily mean that all embodiments include the particular features, structures, and/or characteristics. Additionally, when particular features, structures, and/or characteristics are described in connection with one embodiment, it should be understood that such features, structures, and/or characteristics may also be used connection with other embodiments whether or not explicitly described unless clearly stated to the contrary.

The following detailed description should be read with reference to the drawings in which similar structures in different drawings are numbered the same. The drawings, which are not necessarily to scale, depict illustrative embodiments and are not intended to limit the scope of the disclosure.

Figure 2:
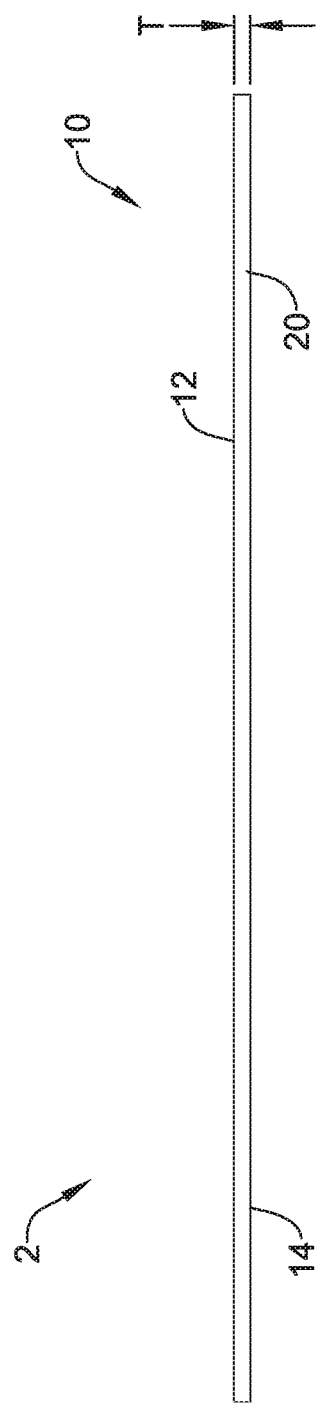
FIG. 2 is a side view of the drink coaster of FIG. 1.
Figure 3:
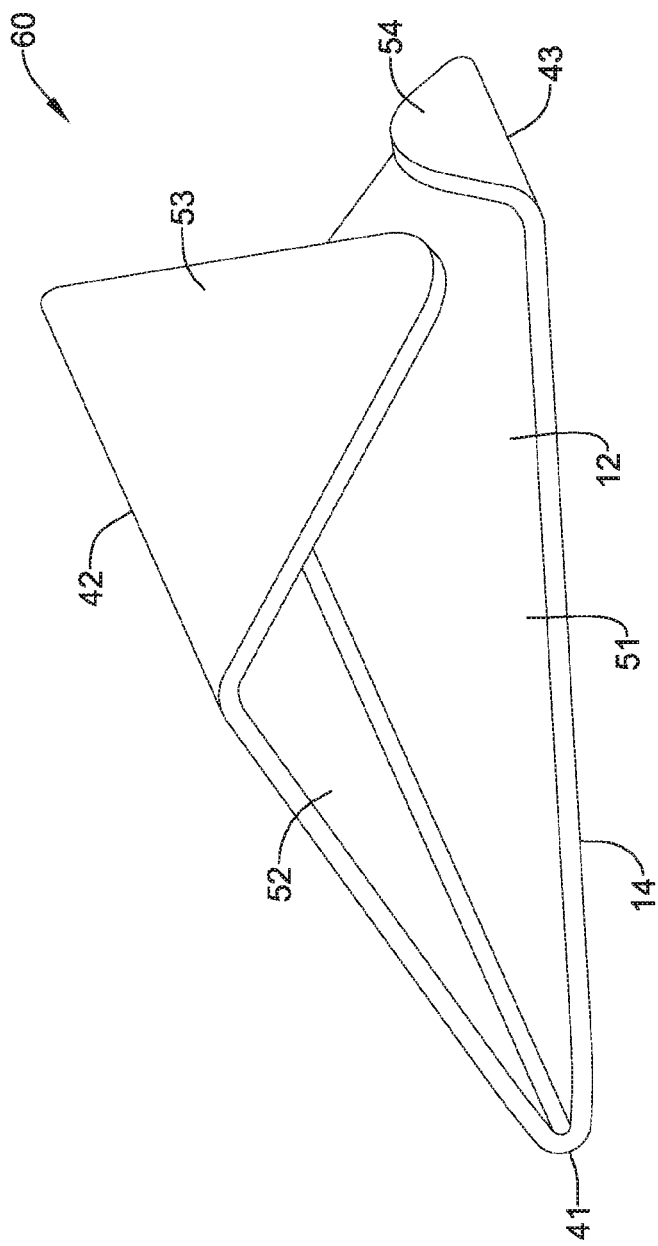
FIG. 3 is a perspective view of the drink coaster of FIG. 1 folded into a stand.
Figure 4:
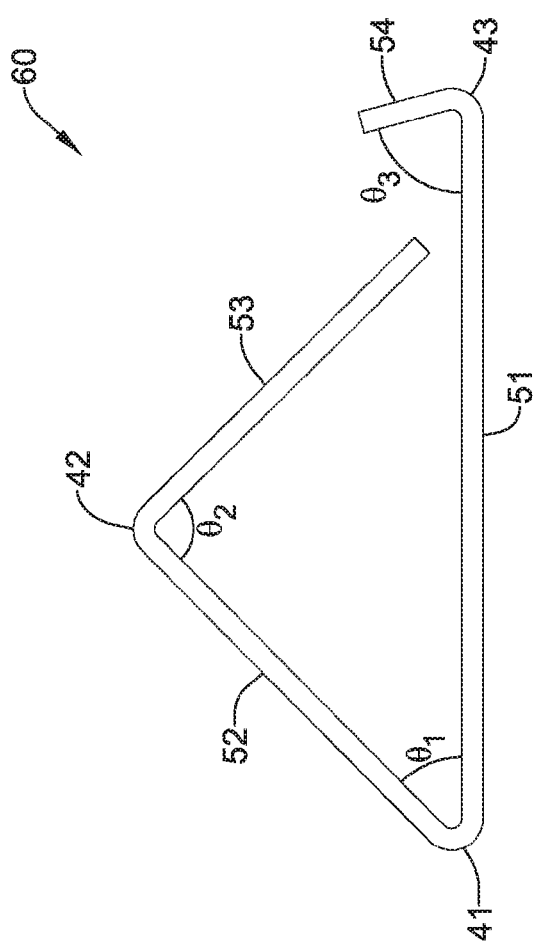
FIG. 4 is a left side view of the folded drink coaster of FIG. 3.
Figure 5:
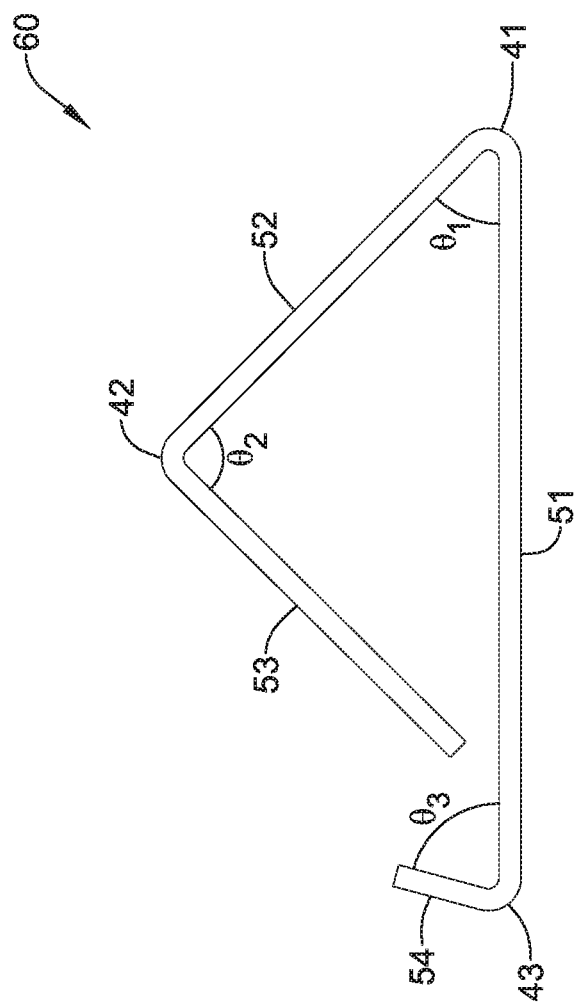
FIG. 5 is a right side view of the folded drink coaster of FIG. 3.
Figure 6:
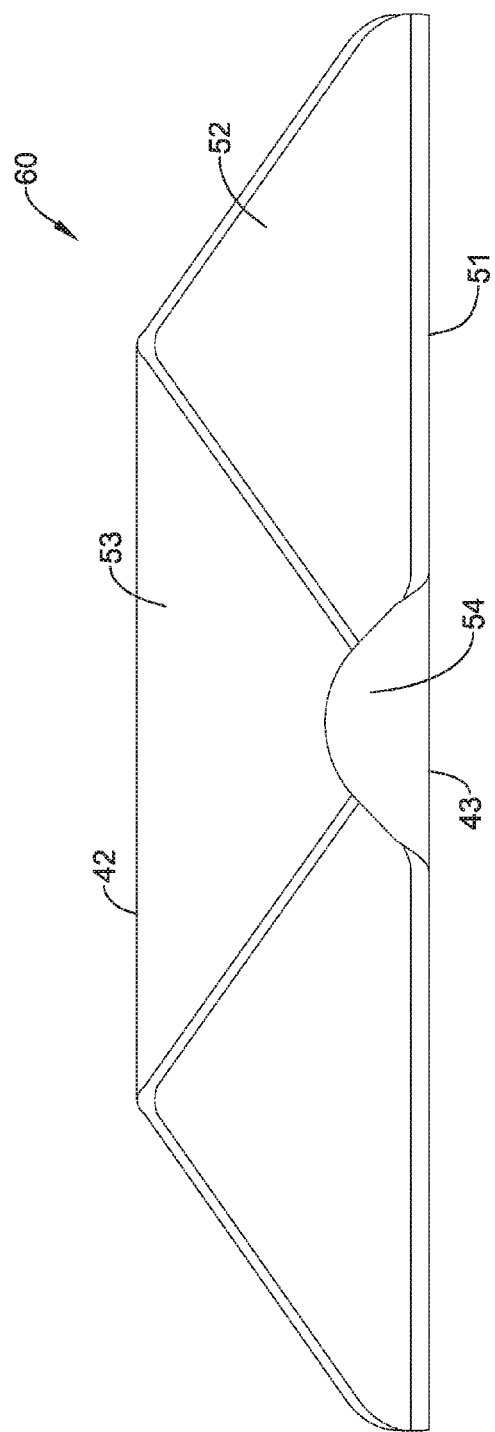
FIG. 6 is a front view of the folded drink coaster of FIG. 3.
Figure 7:
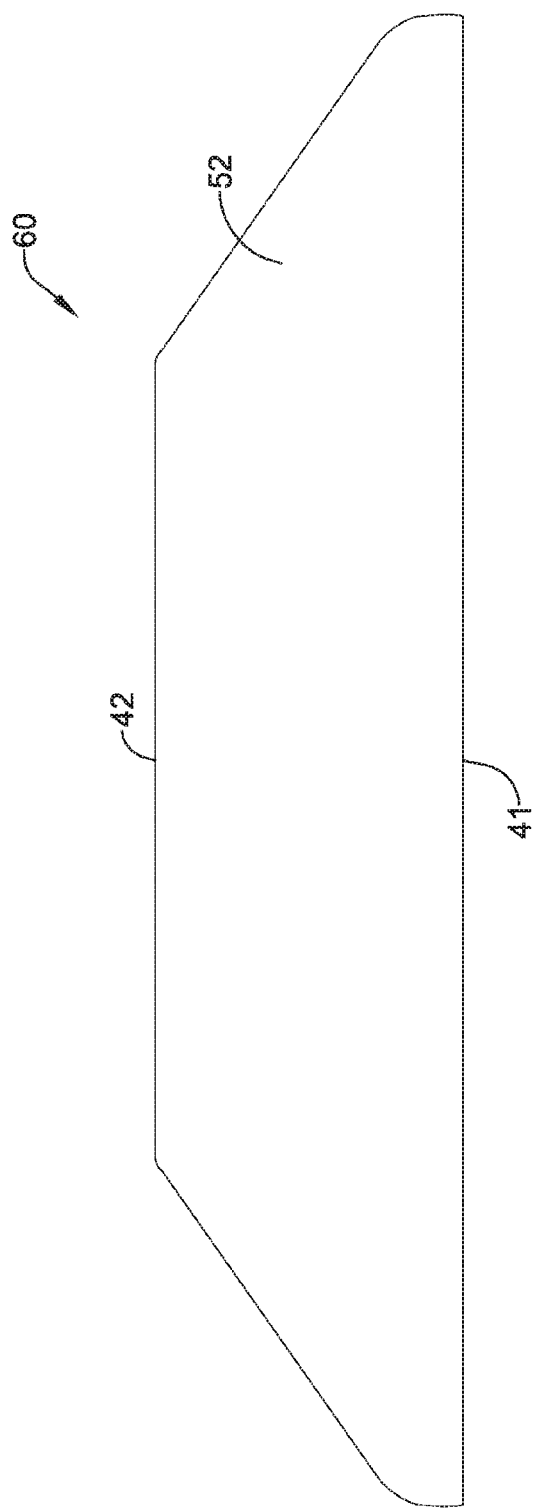
FIG. 7 is a rear view of the folded drink coaster of FIG. 3.
Figure 8:
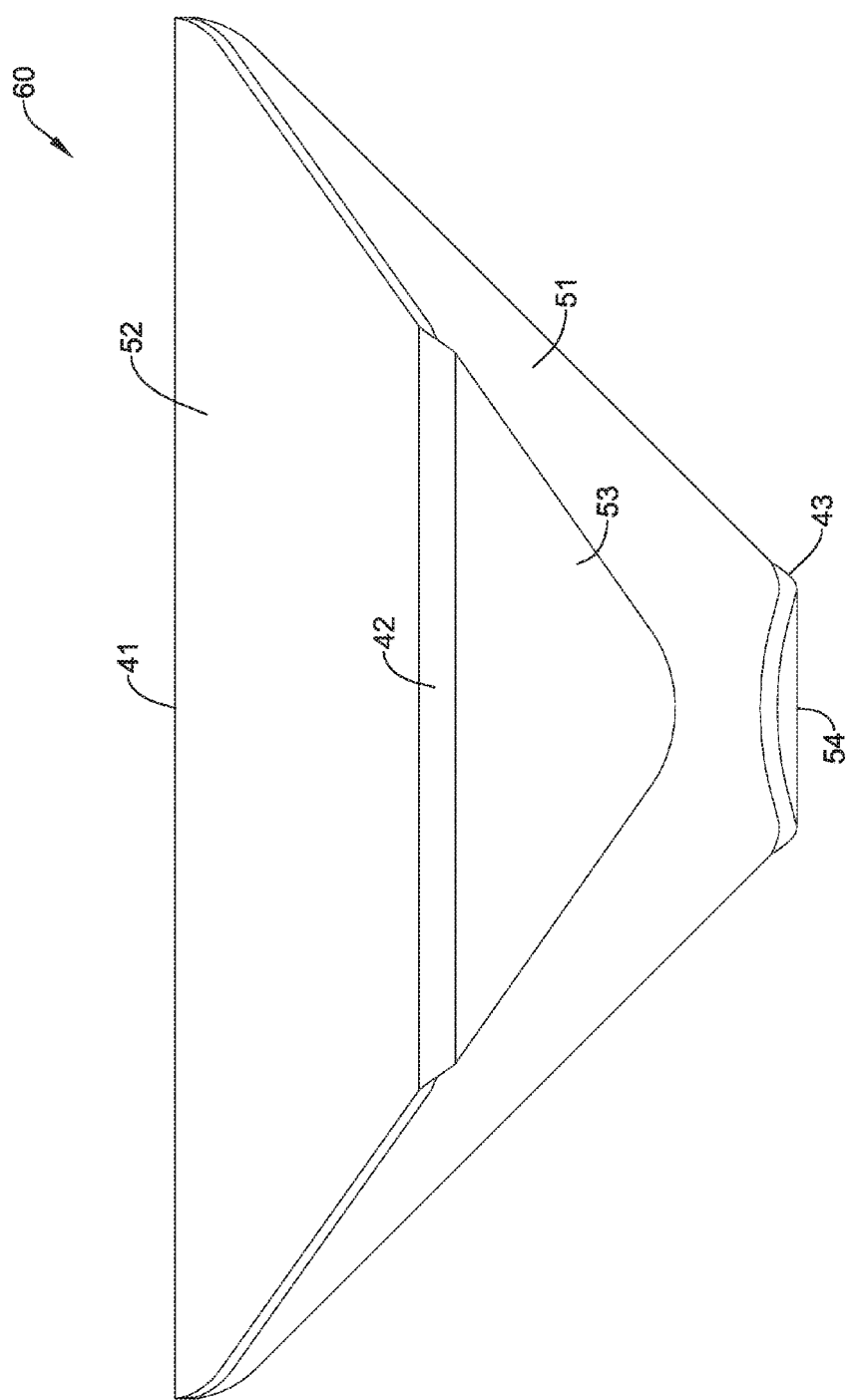
FIG. 8 is a top view of the folded drink coaster of FIG. 3.
Figure 9:
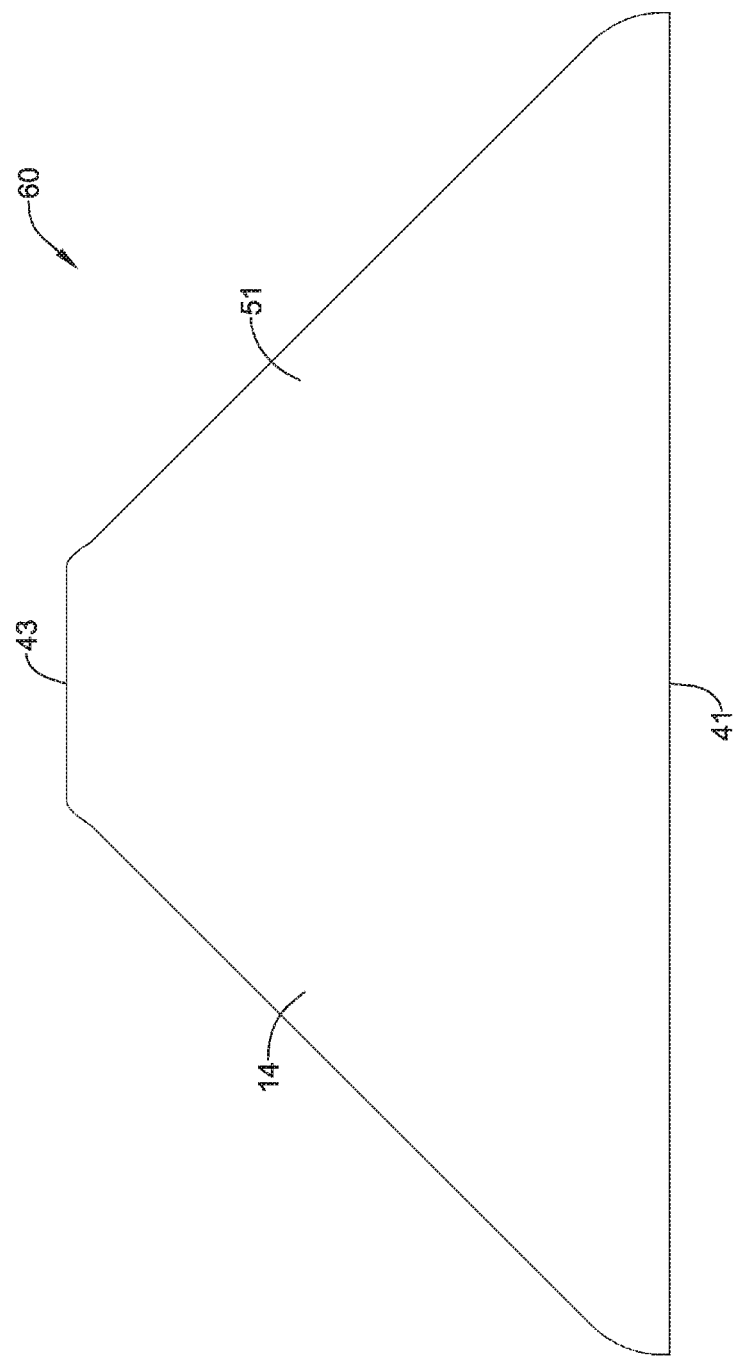
FIG. 9 is a bottom view of the folded drink coaster of FIG. 3.

An exemplary drink coaster 2 is shown in FIGS. 1 and 2. In some instances, the drink coaster 2 may be intended to be disposable after a single use. The drink coaster 2 may include a flat sheet of material 10. In some instances the drink coaster 2 may consist of the flat sheet of material 10. The flat sheet of material 10, forming the drink coaster 2, may have an upper surface 12, an opposite lower surface 14, and a peripheral edge 20 extending around a periphery of the flat sheet of material 10. The peripheral edge 20 may extend from the upper surface 12 to the lower surface 14, and define a thickness T of the flat sheet of material 10. In some instances, the thickness T may be about 0.02 inches to about 0.06 inches, about 0.02 inches to about 0.04 inches, or about 0.03125 inches, for example. The lower surface 14 may be configured to face a flat surface, such as a table top, such that a beverage container (e.g., a cup, bottle, glass, can, etc.) can be placed on the upper surface 12.

The flat sheet of material 10 may be formed of any desired material, or combination of materials. For example, the flat sheet of material 10 may be formed, at least in part, from paperboard, such as cardboard, thick paper, laminated paper, etc. The flat sheet of material 10 may include one or more, or a plurality of layers of similar or dissimilar material. For instance, the flat sheet of material 10 may include one, two, three, four, five or more discrete layers of similar or dissimilar material. In some instances, the flat sheet of material 10 may include a single layer of material, such as paperboard material. In other instances, the flat sheet of material 10 may include multiple layers of similar or dissimilar materials. For instance, as shown in FIG. 1A, which is a cross-section of the drink coaster 2 taken along line 1A-1A of FIG. 1, the flat sheet of material 10 may include a first layer 16, which may be an upper layer defining the upper surface 12 in some instances, and a second layer 18, which may be a lower layer defining the lower surface 14 in some instances.

Figure 1A:
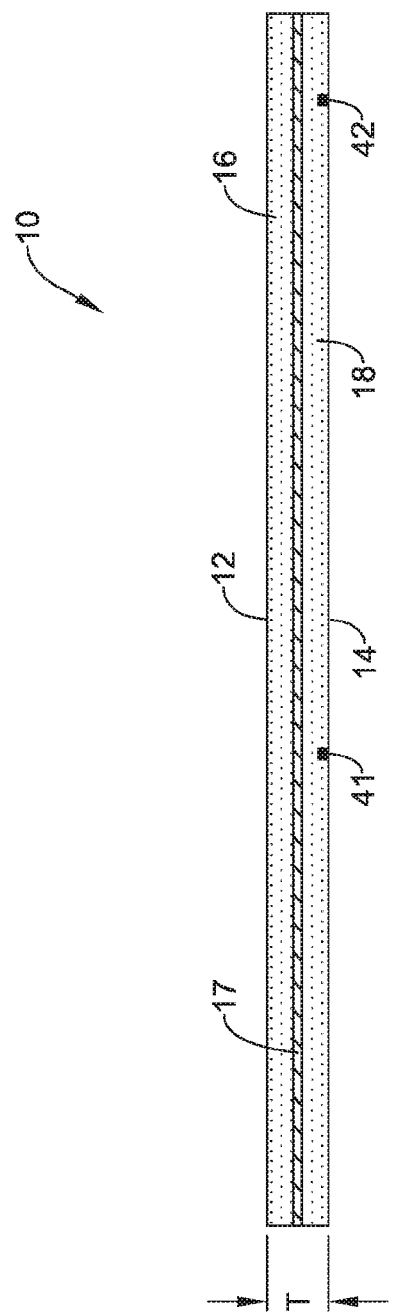
FIG. 1A is a cross-sectional view of the drink coaster of FIG. 1 taken along line 1A-1A.

Also shown in FIG. 1A, the flat sheet of material 10 may also include one or more additional layers or discrete structures, which may, for instance, be interposed between the first, upper layer 16 and the second, lower layer 18. For example, the flat sheet of material 10 may include a plastically deformable layer or structure 17 (e.g., insert) interposed between the first layer 16 and the second layer 18, which may each be paperboard layers, for instance. The plastically deformable layer or structure 17 may be configured as a layer or structure that when bent by hand into a bent shape from its initial shape (e.g., flat) will substantially retain its bent shape without appreciably reverting to or toward its initial shape. Thus, when the flat sheet of material 10 of the coaster 2 is folded by a user from its flat configuration into a folded configuration, as described herein, the deformable layer or structure 17 is configured to retain the folded configuration such that the drink coaster 2 does not appreciably revert to or toward its flat configuration. In some instances the plastically deformable layer or structure 17 may be a malleable metal, such as a metallic foil, a metallic wire, or a metallic band or ribbon, for example. In some instances, the plastically deformable layer or structure 17 may be coextensive with the first and second layers 16, 18 (i.e., extend to the peripheral edge 20 at all points along the periphery). However, in other instances, the plastically deformable layer or structure 17 may only be positioned between a portion of the first and second layers 16, 18, for example. It is contemplated that the flat sheet of material 10, may, alternatively or additionally, include a different deformable layer or structure, such as those described herein.

The flat sheet of material 10 may have any cross-sectional shape when viewed toward the upper or lower surfaces 12, 14. For example, the flat sheet of material 10 may be generally square or round, although other shapes are contemplated. The flat sheet of material 10, if generally square, may have a length measured between opposite sides of about 3.5 inches to about 4.5 inches, or about 4 inches, in some instances. The flat sheet of material 10, if round, may have a diameter of about 3.5 inches to about 4.5 inches, or about 4 inches, in some instances. In saying the flat sheet of material is generally square, what is meant is that the flat sheet of material 10 may include four straight sides or edges with our without rounded corners between the straight sides or edges. For instance, as shown in FIG. 1, the peripheral edge 20 of the flat sheet of material 10 may include a first straight (e.g., planar) side or edge 21, a second straight (e.g., planar) side or edge 22, a third straight (e.g., planar) side or edge 23, and a fourth straight (e.g., planar) side or edge 24. The first straight side or edge 21 may be parallel to the second straight side or edge 22, and the third straight side or edge 23 may be parallel to the fourth straight side or edge 24. Furthermore, the first and second straight sides or edges 21, 22 may be perpendicular to the third and fourth straight sides or edges 23, 24. The length of each of the first, second, third and fourth sides or edges 21, 22, 23, 24 may be equal to one another. In instances, in which the flat sheet of material 10 includes one or more, or a plurality of rounded corners, the peripheral edge 20 may include a first rounded corner 30a, a second rounded corner 30b, a third rounded corner 30c, and/or a fourth rounded corner 30d. The first and third sides or edges 21, 23 may converge at the first rounded corner 30a, the second and fourth sides or edges 22, 24 may converge at the second rounded corner 30b, the second and third sides or edges 22, 23 may converge at the third rounded corner 30c, and/or the first and fourth sides or edges 21, 24 may converge at the fourth rounded corner 30d. The rounded corners 30a, 30b, 30c, 30d may have any desired radius. For example, the rounded corners 30a, 30b, 30c, 30d may have a radius of about 0.25 inches to about 0.5 inches, or about 0.325 inches to about 0.375 inches, in some instances. The generally square flat sheet of material 10 may include zero, one, two, three or four rounded corners, if desired. In other instances, the first and third sides or edges 21, 23 may converge at a first square corner, the second and fourth sides or edges 22, 24 may converge at a second square corner, the second and third sides or edges 22, 23 may converge at a third square corner, and/or the first and fourth sides or edges 21, 24 may converge at a fourth square corner. It is contemplated that the flat sheet of material 10 may include any combination of square and rounded corners, as desired.

The flat sheet of material 10 may include one or more, or a plurality of preferential fold lines for facilitating folding the drink coaster 2 into a stand for an item. The preferential fold line(s) may divide the flat sheet of material 10 into a plurality of panels which may be folded at an angle (at a perpendicular angle or oblique angle) to one another. For example, the flat sheet of material 10 may include a first preferential fold line 41, a second preferential fold line 42, and/or a third preferential fold line 43. In some instances, the first preferential fold line 41, the second preferential fold line 42, and/or the third preferential fold line 43 may be visible on the upper surface 12 and/or the lower surface 14. In some instances the first preferential fold line 41, the second preferential fold line 42, and/or the third preferential fold line 43 may be a perforation line, a score line, or other line or demarcation permitting the flat sheet of material 10 to be folded along the preferential fold line.

The first preferential fold line 41 may extend across the flat sheet of material 10 between a first panel 51 of the flat sheet of material 10 and a second panel 52 of the flat sheet of material 10. The second preferential fold line 42 may extend across the flat sheet of material 10 between the second panel 52 of the flat sheet of material 10 and a third panel 53 of the flat sheet of material 10. The third preferential fold line 43 may extend across the flat sheet of material 10 between the first panel 51 of the flat sheet of material 10 and a fourth panel 54 of the flat sheet of material 10. In some instances, the first preferential fold line 41 may extend parallel to the second preferential fold line 42 and/or the third preferential fold line 43.

The first panel 51 may be defined between the first preferential fold line 41 and the third preferential fold line 43 and extend between the second and third edges 22, 23. The second panel 52 may be defined between the first preferential fold line 41 and the second preferential fold line 42 and extend between the first and fourth edges 21, 24. The third panel 53 may be defined between the second preferential fold line 42 and the fourth corner 30d and extend between the first and fourth edges 21, 24. The fourth panel 54 may be defined between the third preferential fold line 43 and the third corner 30c and extend between the second and third edges 22, 23. Thus, the first panel 51 may be bounded, at least in part or entirely, by the first preferential fold line 41, the third preferential fold line 43, the second edge 22, and the third edge 23. The second panel 52 may be bounded, at least in part or entirely, by the first preferential fold line 41, the second preferential fold line 42, the first edge 21, and the fourth edge 24. The third panel 53 may be bounded, at least in part or entirely, by the second preferential fold line 42, the fourth corner 30d, the first edge 21, and the fourth edge 24. The fourth panel 54 may be bounded, at least in part or entirely, by the third preferential fold line 43, the third corner 30c, the second edge 22, and the third edge 23.

In instances in which the flat sheet of material 10 does not include the third preferential fold line 43, the first panel 51 may be defined between the first preferential fold line 41 and the third corner 30c and extend between the second and third edges 22, 23. Thus, the first panel 51 may be bounded, at least in part or entirely, by the first preferential fold line 41, the third corner 30c, the second edge 22, and the third edge 23.

The first panel 51 may have a first surface area (e.g., the portion of the upper or lower surface 12, 14 occupied by the first panel), the second panel 52 may have a second surface area (e.g., the portion of the upper or lower surface 12, 14 occupied by the second panel), the third panel 53 may have a third surface area (e.g., the portion of the upper or lower surface 12, 14 occupied by the third panel), and the fourth panel 54 may have a fourth surface area (e.g., the portion of the upper or lower surface 12, 14 occupied by the fourth panel). In some instances, the surface area of the first panel 51 may be greater than the surface area of the second panel 52, the surface area of the second panel 52 may be greater than the surface area of the third panel 53, and the surface area of the third panel 53 may be greater than the surface area of the fourth panel 54.

In some instances, the first preferential fold line 41 may bisect, or substantially bisect the upper surface 12 and/or lower surface 14 of the flat sheet of material 10. For example, the first preferential fold line 41 may extend from the first corner (e.g., the rounded corner 30a) between the first and third edges 21, 23 to the second corner (e.g., the rounded corner 30b) between the second and fourth edges 22, 24. In describing the first preferential fold line 41 as substantially bisecting the upper surface 12, what is meant is that at least 40% of the surface area of the upper surface 12 is on each side of the first preferential fold line 41. In some instances, at least 45% of the surface area of the upper surface 12 is on each side of the first preferential fold line 41. It follows that in describing the first preferential fold line 41 as substantially bisecting the lower surface 14, what is meant is that at least 40% of the surface area of the lower surface 14 is on each side of the first preferential fold line 41. In some instances, at least 45% of the surface area of the lower surface 14 is on each side of the first preferential fold line 41.

The flat sheet of material 10 forming the drink coaster 2 may be configured to be folded from the flat configuration shown in FIGS. 1 and 2 to a folded configuration shown in FIGS. 3-9 to be used as a stand 60 for an item. For example, the stand 60 may be used to hold an electronic device, such as a smartphone, a tablet, or other electronic device in an elevated or propped position for better viewing of a screen of the device. The flat sheet of material 10 may be folded along one or more of the preferential fold lines, such as along the first preferential fold line 41, the second preferential fold line 42, and/or the third preferential fold line 43 to convert the drink coaster 2 into the folded configuration. For example, the second panel 52 may be folded relative to the first panel 51 along the first preferential fold line 41, the third panel 53 may be folded relative to the second panel 52 along the second preferential fold line 42, and/or the fourth panel 54 may be folded relative to the first panel 51 along the third preferential fold line 43.

In the folded configuration, the first panel 51 may be planar, the second panel 52 may be planar, the third panel 53 may be planar, and/or the fourth panel 54 may be planar. Each of the first, second, third, and fourth panels may be non-planar with each of the other panels in the folded configuration, wherein each of the first, second, third, and fourth panels may be coplanar in the flat configuration.

In the folded configuration, the first panel 51 may configured to be positioned on a flat surface, such as a table top with the lower surface 14 facing the flat surface. In the folded configuration, the second panel 52 may extend from the first preferential fold line 41 at an acute angle $\theta_1$ from the first panel 51 such that the second panel 52 is non-parallel to the first panel 51. In some instances, the acute angle $\theta_1$ may be about 25 degrees to about 60 degrees, about 30 degrees to about 50 degrees, about 30 degrees to about 45 degrees, about 45 degrees to about 60 degrees, about 40 degrees to about 50 degrees, or about 45 degrees for example. In the folded configuration, the third panel 53 may extend from the second preferential fold line 42 at an angle $\theta_2$ (e.g., a perpendicular or oblique angle) from the second panel 52 such that the third panel 53 is non-parallel to the second panel 52 and the first panel 51. In some instances, the angle $\theta_2$ may be about 70 degrees to about 110 degrees, about 75 degrees to about 105 degrees, about 80 degrees to about 100 degrees, about 85 degrees to about 95 degrees, about 85 degrees, about 90 degrees, or about 95 degrees for example. In the folded configuration, the fourth panel 54 may extend from the third preferential fold line 43 at an angle $\theta_3$ (e.g., a perpendicular or oblique angle) from the first panel 51 such that the fourth panel 54 is non-parallel to the first panel 51. In some instances, the angle $\theta_3$ may about 70 degrees to about 110 degrees, about 75 degrees to about 105 degrees, about 80 degrees to about 100 degrees, about 85 degrees to about 95 degrees, about 85 degrees, about 90 degrees, or about 95 degrees for example.

Figure 10:
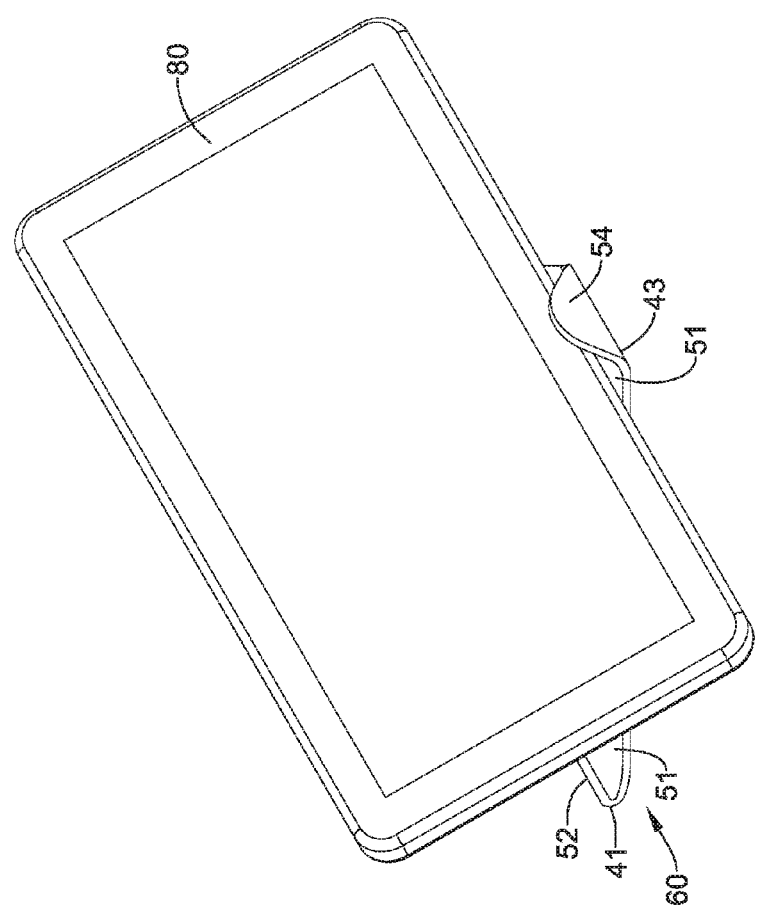
FIG. 10 is a perspective of the folded drink coaster of FIG. 3 used as a stand to prop up an electronic device.
Figure 11:
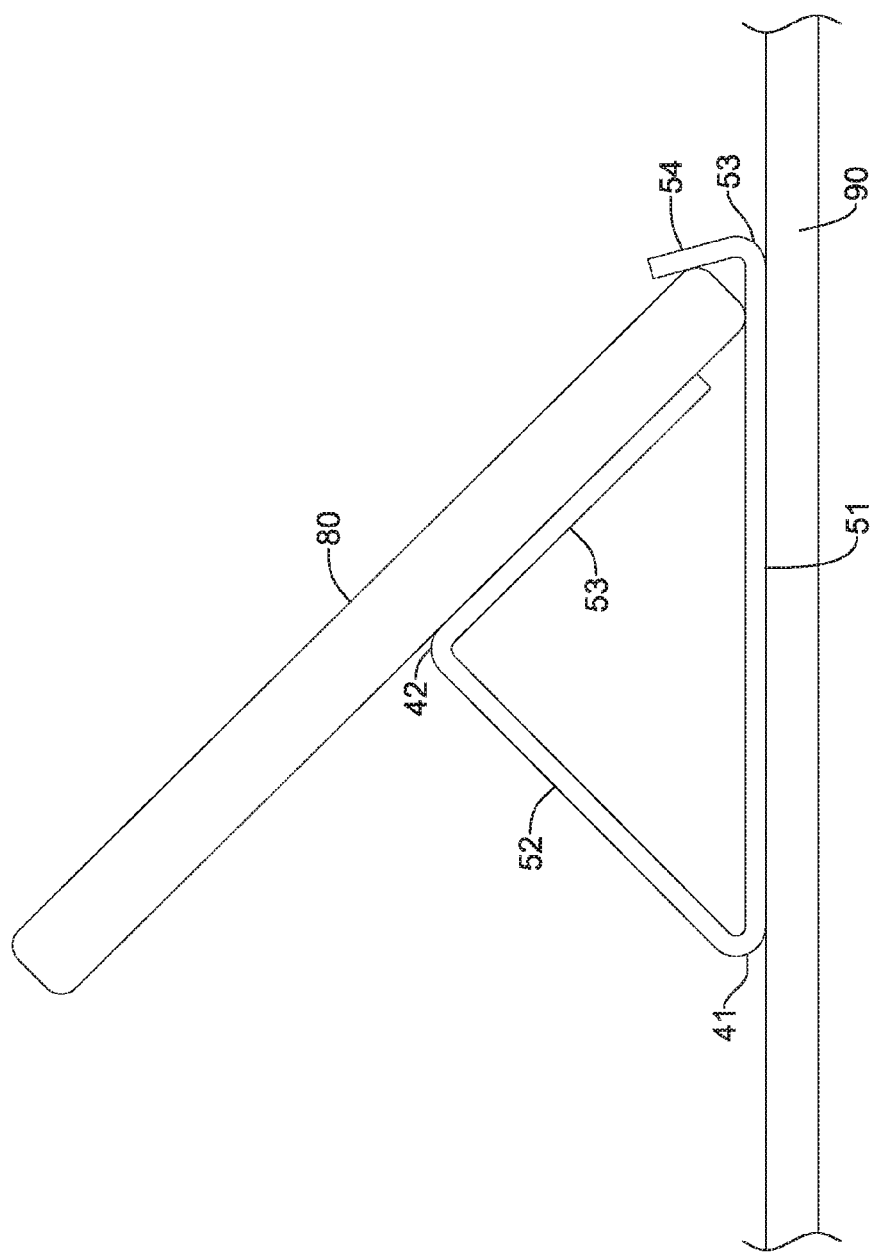
FIG. 11 is a side view of the folded drink coaster of FIG. 3 used as a stand to prop up an electronic device.

FIGS. 10 and 11 depict the stand 60 propping up an electronic device 80 in an inclined position. As shown in FIGS. 10 and 11, the first panel 51 of the stand 60 may be positioned on a flat surface 90, such as a table top, with the lower surface 14 facing the flat surface 90. An edge of the electronic device 80 may rest against the upper surface 12 of the first panel 51 while the rear surface of the electronic device 80 may rest against the lower surface 14 of the third panel 53. The fourth panel 54, if present, may be juxtaposed with the edge of the electronic device 80 and face a front of the electronic device 80. The fourth panel 54 may help prevent the electronic device 80 from sliding with the electronic device 80 in the inclined position without obstructing the view of the screen of the electronic device 80. In other instances, the upper surface 12 may include a coating or layer having a high coefficient of friction to prevent the electronic device 80 from sliding with the electronic device 80 in the inclined position.

Figure 12:
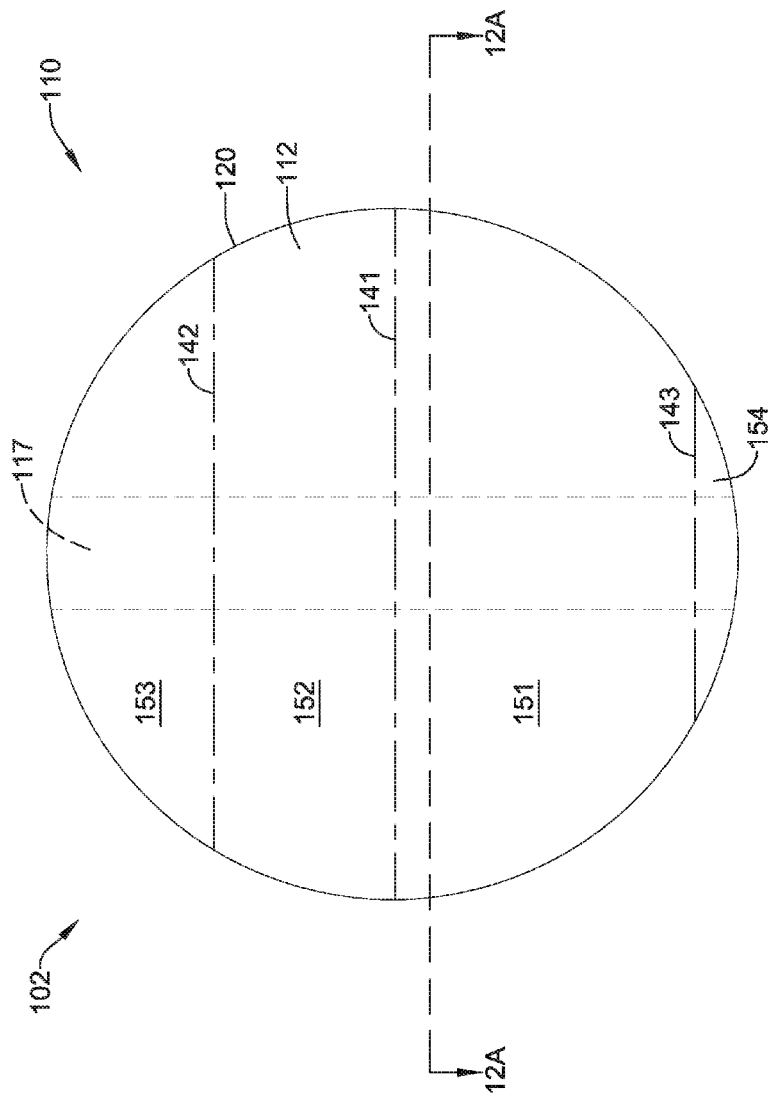
FIG. 12 is a top view of another exemplary drink coaster.
Figure 13:
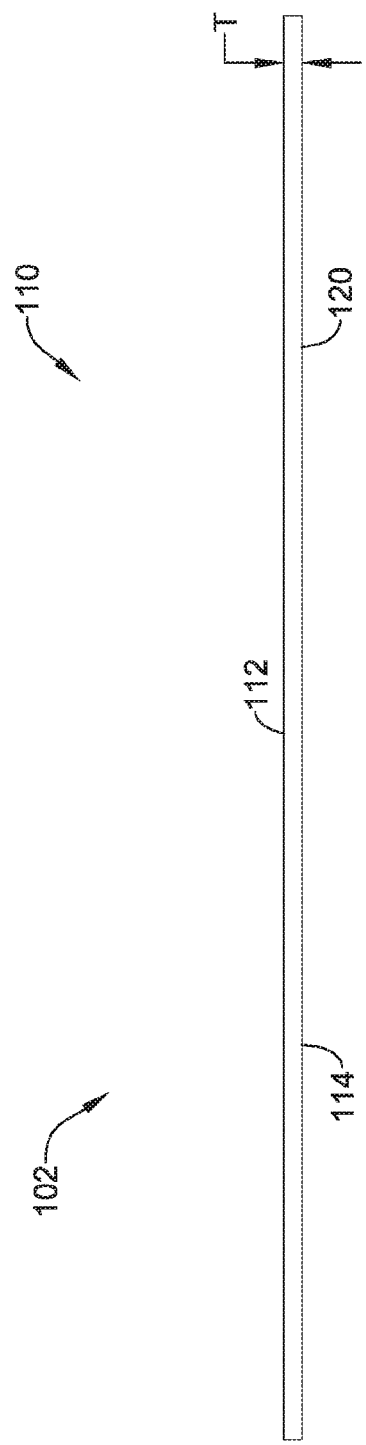
FIG. 13 is a side view of the drink coaster of FIG. 12.
Figure 14:
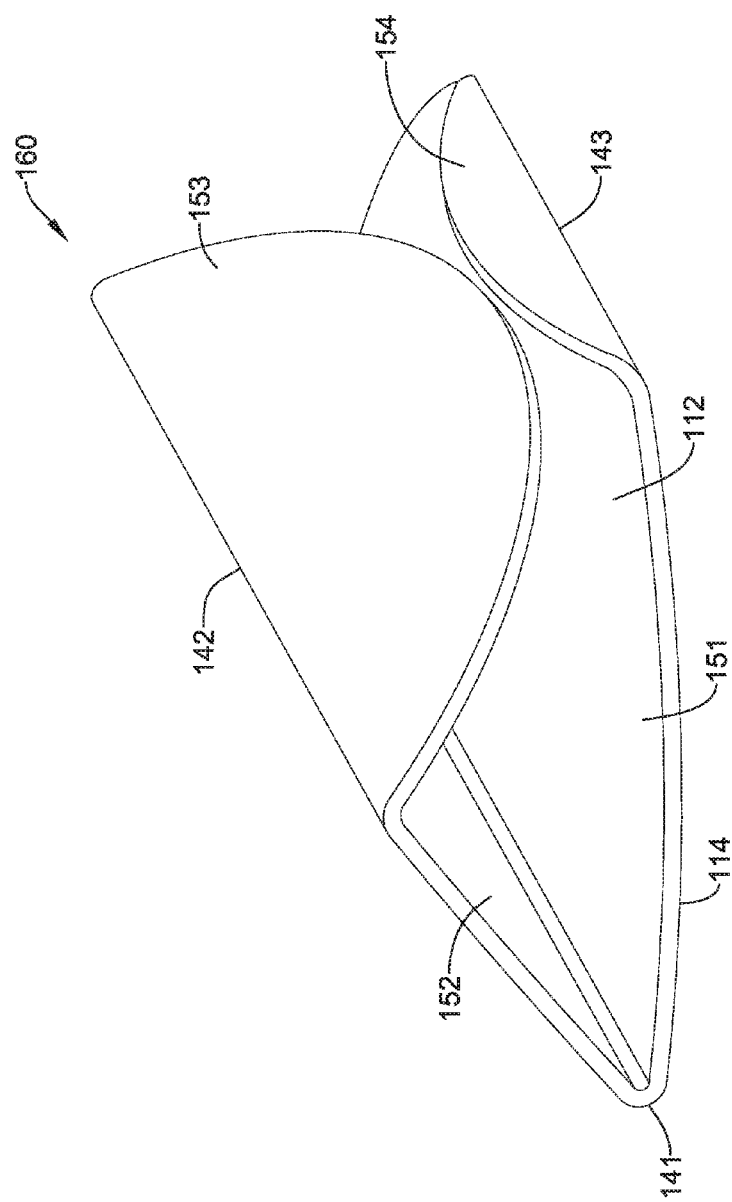
FIG. 14 is a perspective view of the drink coaster of FIG. 12 folded into a stand.
Figure 15:
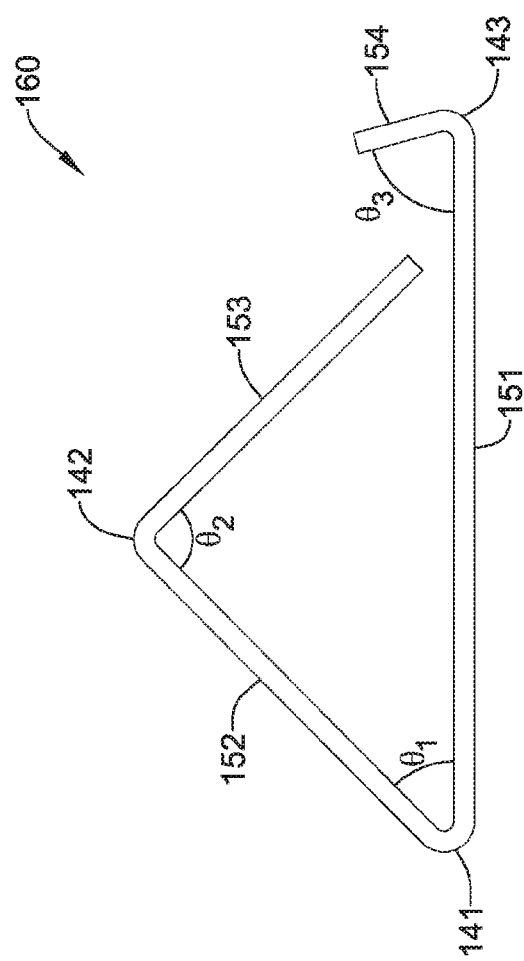
FIG. 15 is a left side view of the folded drink coaster of FIG. 14.
Figure 16:
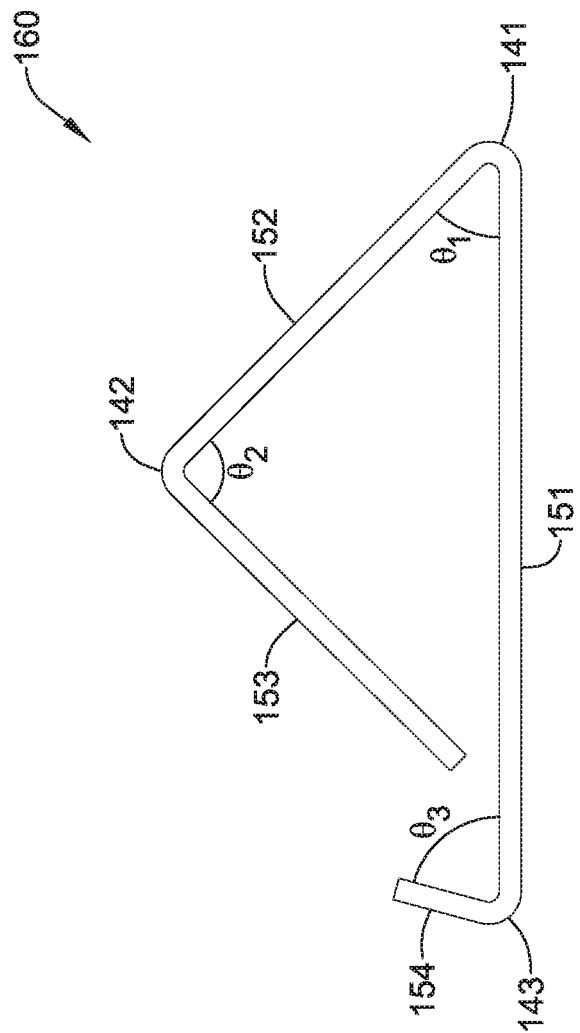
FIG. 16 is a right side view of the folded drink coaster of FIG. 14.
Figure 17:
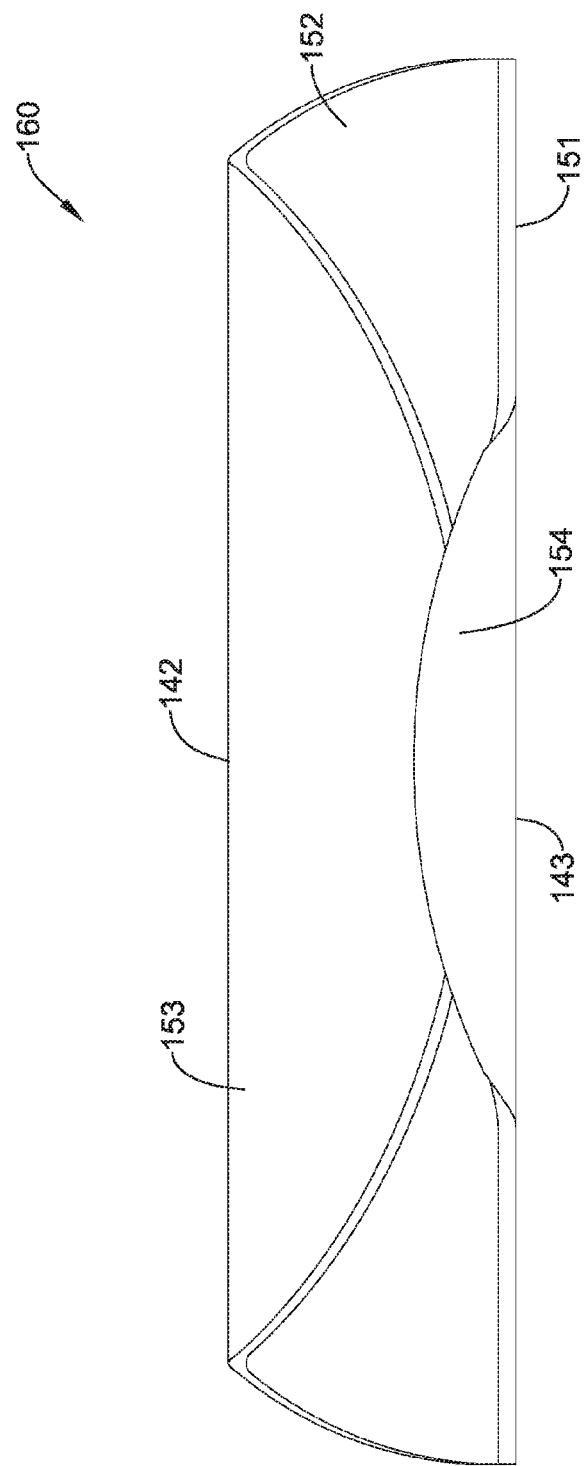
FIG. 17 is a front view of the folded drink coaster of FIG. 14.
Figure 18:
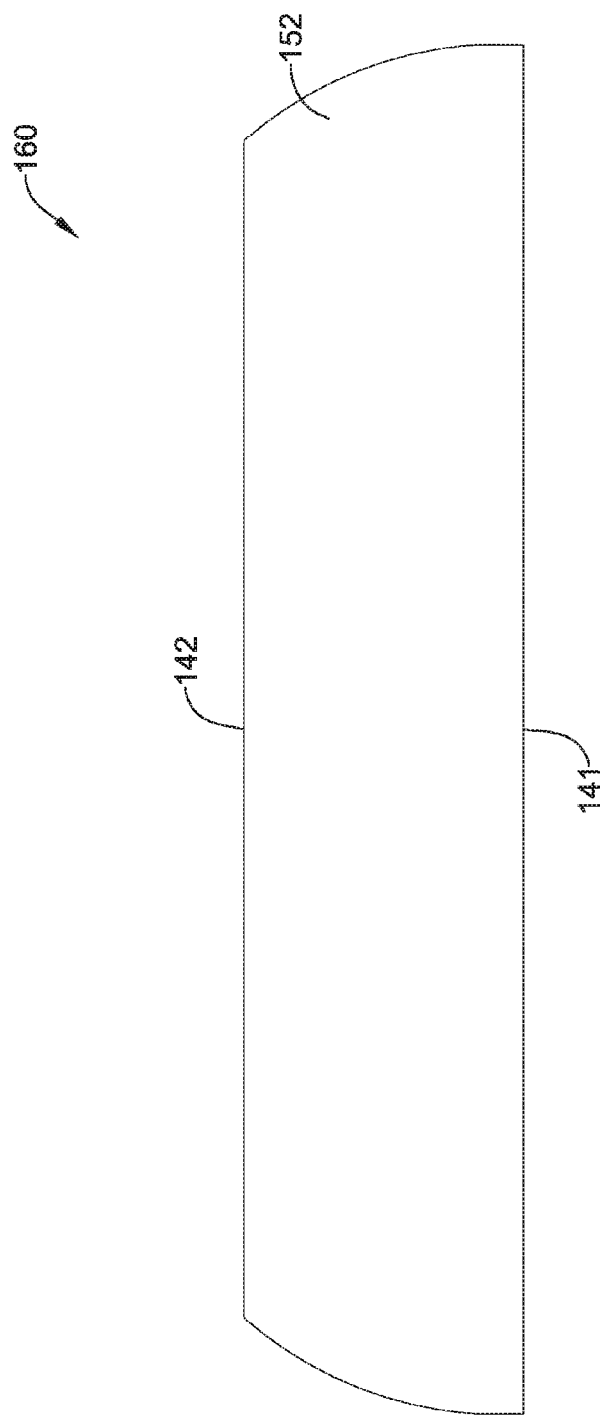
FIG. 18 is a rear view of the folded drink coaster of FIG. 14.
Figure 19:
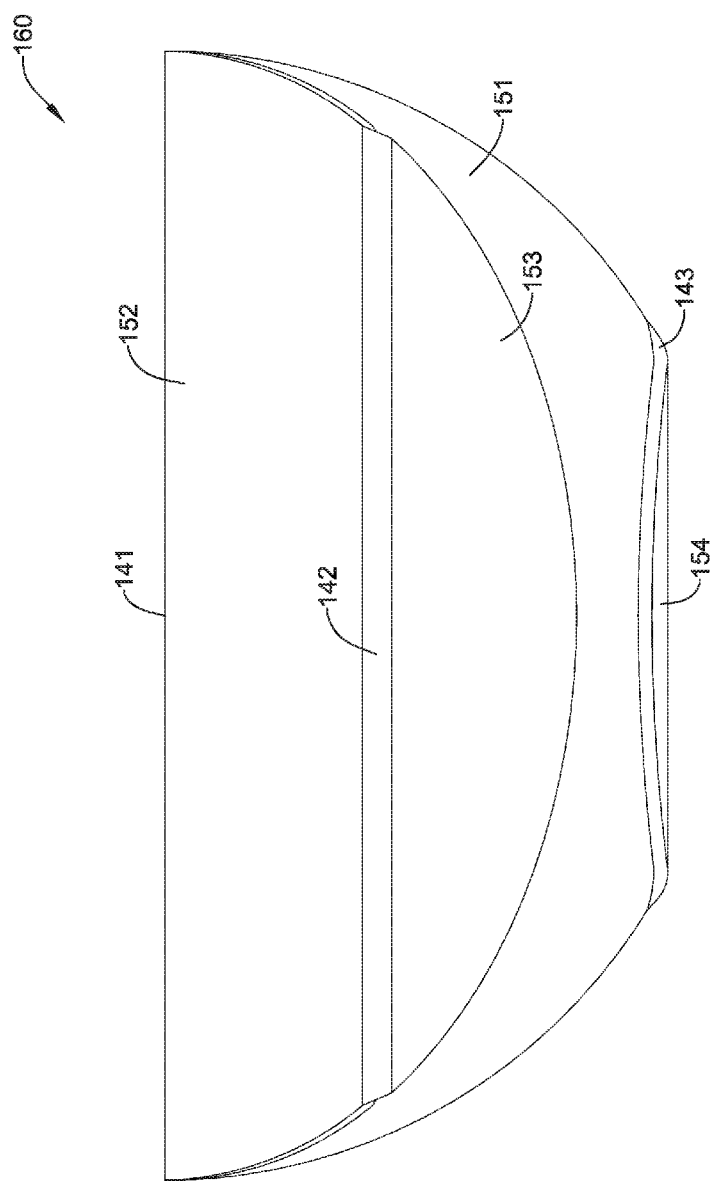
FIG. 19 is a top view of the folded drink coaster of FIG. 14.
Figure 20:
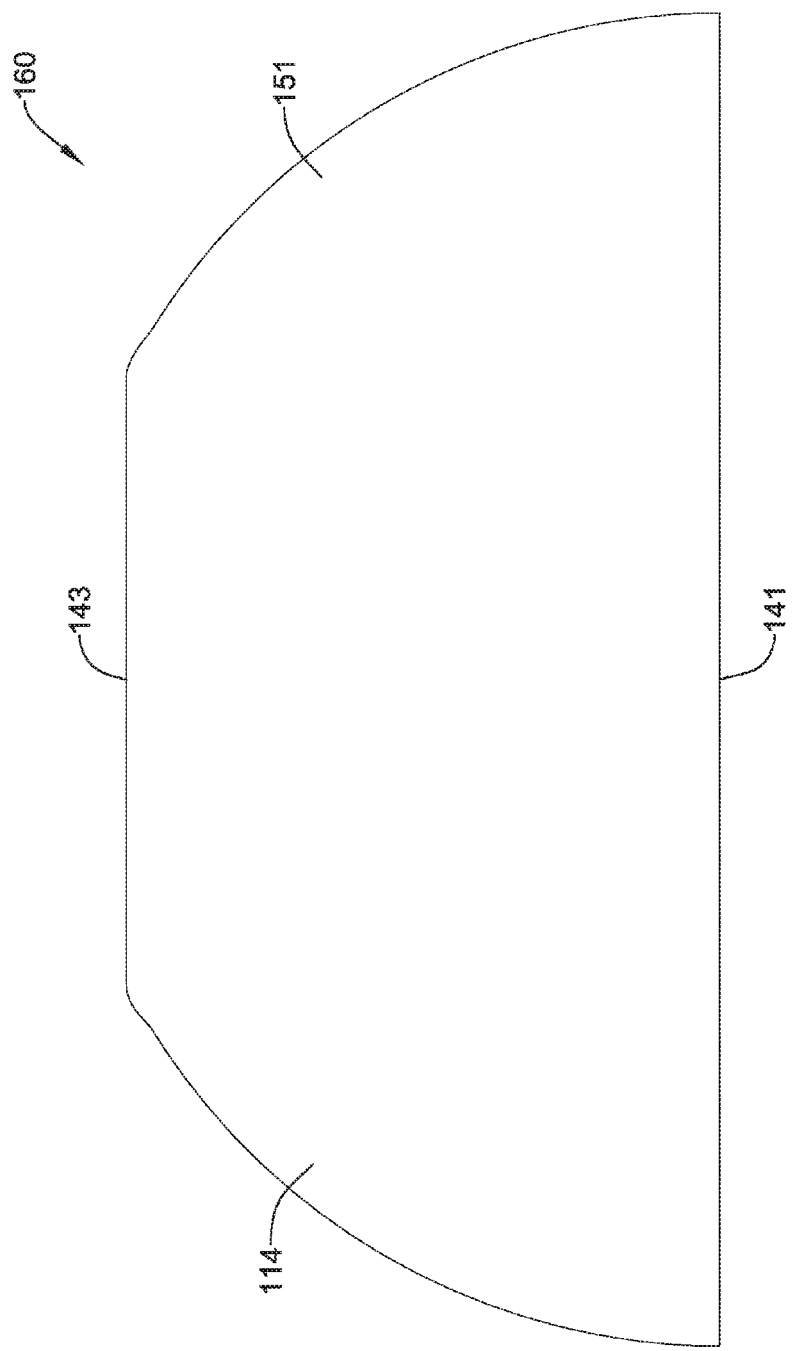
FIG. 20 is a bottom view of the folded drink coaster of FIG. 14.

Another exemplary drink coaster 102 is shown in FIGS. 12 and 13. In some instances, the drink coaster 102 may be intended to be disposable after a single use. The drink coaster 102 may include a flat sheet of material 110. In some instances the drink coaster 102 may consist of the flat sheet of material 110. The flat sheet of material 110, forming the drink coaster 102, may have an upper surface 112, an opposite lower surface 114, and a peripheral edge 120 extending around a periphery of the flat sheet of material 110. The peripheral edge 120 may extend from the upper surface 112 to the lower surface 114, and define a thickness T of the flat sheet of material 110. In some instances, the thickness T may be about 0.02 inches to about 0.06 inches, about 0.02 inches to about 0.04 inches, or about 0.03125 inches, for example. The lower surface 114 may be configured to face a flat surface, such as a table top, such that a beverage container (e.g., a cup, bottle, glass, can, etc.) can be placed on the upper surface 112.

The flat sheet of material 110 may be formed of any desired material, or combination of materials. For example, the flat sheet of material 110 may be formed, at least in part, from paperboard, such as cardboard, thick paper, laminated paper, etc. The flat sheet of material 110 may include one or more, or a plurality of layers of similar or dissimilar material. For instance, the flat sheet of material 110 may include one, two, three, four, five or more discrete layers of similar or dissimilar material. In some instances, the flat sheet of material 110 may include a single layer of material, such as paperboard material. In other instances, the flat sheet of material 110 may include multiple layers of similar or dissimilar materials. For instance, as shown in FIG. 12A, which is a cross-section of the drink coaster 102 taken along line 12A-12A of FIG. 12, the flat sheet of material 110 may include a first layer 116, which may be an upper layer defining the upper surface 112 in some instances, and a second layer 118, which may be a lower layer defining the lower surface 114 in some instances.

Also shown in FIG. 12A, the flat sheet of material 110 may also include one or more additional layers or discrete structures, which may, for instance, be interposed between the first, upper layer 116 and the second, lower layer 118. For example, the flat sheet of material 110 may include a plastically deformable layer or structure 117 (e.g., insert) interposed between the first layer 116 and the second layer 118, which may each be paperboard layers, for instance. The plastically deformable layer or structure 117 may be configured as a layer or structure that when bent by hand into a bent shape from its initial shape (e.g., flat) will substantially retain its bent shape without appreciably reverting to or toward its initial shape. Thus, when the flat sheet of material 110 of the coaster 102 is folded by a user from its flat configuration into a folded configuration, as described herein, the deformable layer or structure 117 is configured to retain the folded configuration such that the drink coaster 102 does not appreciably revert to or toward its flat configuration. In some instances the plastically deformable layer or structure 117 may be a malleable metal, such as a metallic foil, a metallic wire, or a metallic band or ribbon, for example. In some instances, the plastically deformable layer or structure 117 may be coextensive with the first and second layers 116, 118 (i.e., extend to the peripheral edge 120 at all points along the periphery). However, in other instances, the plastically deformable layer or structure 117 may only be positioned between a portion of the first and second layers 116, 118, for example. As shown in FIG. 12A, the plastically deformable layer or structure 117 may be an elongate band or ribbon extending across the flat sheet of material 110. The elongate band or ribbon may extend generally perpendicular to the preferential fold lines 141, 142, 143, described herein. It is contemplated that the flat sheet of material 110, may, alternatively or additionally, include a different deformable layer or structure, such as those described herein.

The flat sheet of material 110 may have any cross-sectional shape when viewed toward the upper or lower surfaces 112, 114. For example, the flat sheet of material 10 may be generally square or round, although other shapes are contemplated. In the event the flat sheet of material 110 has a round cross-sectional shape, the peripheral side or edge 120 may extend around the circumference of the flat sheet of material 110.

The flat sheet of material 110 may include one or more, or a plurality of preferential fold lines for facilitating folding the drink coaster 102 into a stand for an item. The preferential fold line(s) may divide the flat sheet of material 110 into a plurality of panels which may be folded at an angle (at a perpendicular angle or oblique angle) to one another. For example, the flat sheet of material 110 may include a first preferential fold line 141, a second preferential fold line 142, and/or a third preferential fold line 143. In some instances, the first preferential fold line 141, the second preferential fold line 142, and/or the third preferential fold line 143 may be visible on the upper surface 112 and/or the lower surface 114. In some instances the first preferential fold line 141, the second preferential fold line 142, and/or the third preferential fold line 143 may be a perforation line, a score line, or other line or demarcation permitting the flat sheet of material 110 to be folded along the preferential fold line.

The first preferential fold line 141 may extend across the flat sheet of material 110 between a first panel 151 of the flat sheet of material 110 and a second panel 152 of the flat sheet of material 110. The second preferential fold line 142 may extend across the flat sheet of material 110 between the second panel 152 of the flat sheet of material 110 and a third panel 153 of the flat sheet of material 110. The third preferential fold line 143 may extend across the flat sheet of material 110 between the first panel 151 of the flat sheet of material 110 and a fourth panel 154 of the flat sheet of material 110. In some instances, the first preferential fold line 141 may extend parallel to the second preferential fold line 142 and/or the third preferential fold line 143.

The first panel 151 may be defined between the first preferential fold line 141 and the third preferential fold line 143 and extend to the peripheral edge 120 therebetween. The second panel 152 may be defined between the first preferential fold line 141 and the second preferential fold line 142 and extend to the peripheral edge 120 therebetween. The third panel 153 may be defined between the second preferential fold line 142 and the portion of the peripheral edge 120 extending between opposite ends of the second preferential fold line 142. The fourth panel 154 may be defined between the third preferential fold line 143 and the portion of the peripheral edge 120 extending between opposite ends of the third preferential fold line 143. Thus, the first panel 151 may be bounded, at least in part or entirely, by the first preferential fold line 141, the third preferential fold line 143, and the portions of the peripheral edge 120 extending between ends of the first and third preferential fold lines 141, 143. The second panel 152 may be bounded, at least in part or entirely, by the first preferential fold line 141, the second preferential fold line 142, and the portions of the peripheral edge 120 extending between ends of the first and second preferential fold lines 141, 142. The third panel 153 may be bounded, at least in part or entirely, by the second preferential fold line 142 and the portion of the peripheral edge 120 extending between opposite ends of the second preferential fold line 142. The fourth panel 154 may be bounded, at least in part or entirely, by the third preferential fold line 143 and the portion of the peripheral edge 120 extending between opposite ends of the third preferential fold line 143.

In instances in which the flat sheet of material 110 does not include the third preferential fold line 143, the first panel 151 may be defined between the first preferential fold line 141 and the portion of the peripheral edge 120 extending between opposite ends of the first preferential fold line 143. Thus, the first panel 151 may be bounded, at least in part or entirely, by the first preferential fold line 141 and the portion of the peripheral edge 120 extending between opposite ends of the first preferential fold line 143.

The first panel 151 may have a first surface area (e.g., the portion of the upper or lower surface 112, 114 occupied by the first panel), the second panel 152 may have a second surface area (e.g., the portion of the upper or lower surface 112, 114 occupied by the second panel), the third panel 153 may have a third surface area (e.g., the portion of the upper or lower surface 112, 114 occupied by the third panel), and the fourth panel 154 may have a fourth surface area (e.g., the portion of the upper or lower surface 112, 114 occupied by the fourth panel). In some instances, the surface area of the first panel 151 may be greater than the surface area of the second panel 152, the surface area of the second panel 152 may be greater than the surface area of the third panel 153, and the surface area of the third panel 153 may be greater than the surface area of the fourth panel 154.

In some instances, the first preferential fold line 141 may bisect, or substantially bisect the upper surface 112 and/or lower surface 114 of the flat sheet of material 110. For example, the first preferential fold line 141 may extend across the flat sheet of material 110 through the center of the flat sheet of material 110. In describing the first preferential fold line 141 as substantially bisecting the upper surface 112, what is meant is that at least 40% of the surface area of the upper surface 112 is on each side of the first preferential fold line 141. In some instances, at least 45% of the surface area of the upper surface 112 is on each side of the first preferential fold line 141. It follows that in describing the first preferential fold line 141 as substantially bisecting the lower surface 114, what is meant is that at least 40% of the surface area of the lower surface 114 is on each side of the first preferential fold line 141. In some instances, at least 45% of the surface area of the lower surface 114 is on each side of the first preferential fold line 141.

The flat sheet of material 110 forming the drink coaster 102 may be configured to be folded from the flat configuration shown in FIGS. 12 and 13 to a folded configuration shown in FIGS. 14-20 to be used as a stand 160 for an item. For example, the stand 160 may be used to hold an electronic device, such as a smartphone, a tablet, or other electronic device in an elevated or propped position for better viewing of a screen of the device. The flat sheet of material 110 may be folded along one or more of the preferential fold lines, such as along the first preferential fold line 141, the second preferential fold line 142, and/or the third preferential fold line 143 to convert the drink coaster 102 into the folded configuration. For example, the second panel 152 may be folded relative to the first panel 151 along the first preferential fold line 141, the third panel 153 may be folded relative to the second panel 152 along the second preferential fold line 142, and/or the fourth panel 154 may be folded relative to the first panel 151 along the third preferential fold line 143.

In the folded configuration, the first panel 151 may be planar, the second panel 152 may be planar, the third panel 153 may be planar, and/or the fourth panel 154 may be planar. Each of the first, second, third, and fourth panels may be non-planar with each of the other panels in the folded configuration, wherein each of the first, second, third, and fourth panels may be coplanar in the flat configuration.

In the folded configuration, the first panel 151 may configured to be positioned on a flat surface, such as a table top with the lower surface 114 facing the flat surface. In the folded configuration, the second panel 152 may extend from the first preferential fold line 141 at an acute angle $\theta_1$ from the first panel 151 such that the second panel 152 is non-parallel to the first panel 151. In some instances, the acute angle $\theta_1$ may be about 25 degrees to about 60 degrees, about 30 degrees to about 50 degrees, about 30 degrees to about 45 degrees, about 45 degrees to about 60 degrees, about 40 degrees to about 50 degrees, or about 45 degrees for example. In the folded configuration, the third panel 153 may extend from the second preferential fold line 142 at an angle $\theta_2$ (e.g., a perpendicular or oblique angle) from the second panel 152 such that the third panel 153 is non-parallel to the second panel 152 and the first panel 151. In some instances, the angle $\theta_2$ may be about 70 degrees to about 110 degrees, about 75 degrees to about 105 degrees, about 80 degrees to about 100 degrees, about 85 degrees to about 95 degrees, about 85 degrees, about 90 degrees, or about 95 degrees for example. In the folded configuration, the fourth panel 154 may extend from the third preferential fold line 143 at an angle $\theta_3$ (e.g., a perpendicular or oblique angle) from the first panel 151 such that the fourth panel 154 is non-parallel to the first panel 151. In some instances, the angle $\theta_3$ may about 70 degrees to about 110 degrees, about 75 degrees to about 105 degrees, about 80 degrees to about 100 degrees, about 85 degrees to about 95 degrees, about 85 degrees, about 90 degrees, or about 95 degrees for example.

In the folded configuration, the stand 160 may be used for propping up an electronic device in an inclined position, similar to that shown in FIGS. 10 and 11. For example, the first panel 151 of the stand 160 may be positioned on a flat surface, such as a table top, with the lower surface 114 facing the flat surface. An edge of the electronic device may rest against the upper surface 112 of the first panel 151 while the rear surface of the electronic device may rest against the lower surface 114 of the third panel 153. The fourth panel 154, if present, may be juxtaposed with the edge of the electronic device and face a front of the electronic device. The fourth panel 154 may help prevent the electronic device from sliding with the electronic device in the inclined position without obstructing the view of the screen of the electronic device. In other instances, the upper surface 112 may include a coating or layer having a high coefficient of friction to prevent the electronic device from sliding with the electronic device in the inclined position.

Figure 21A:
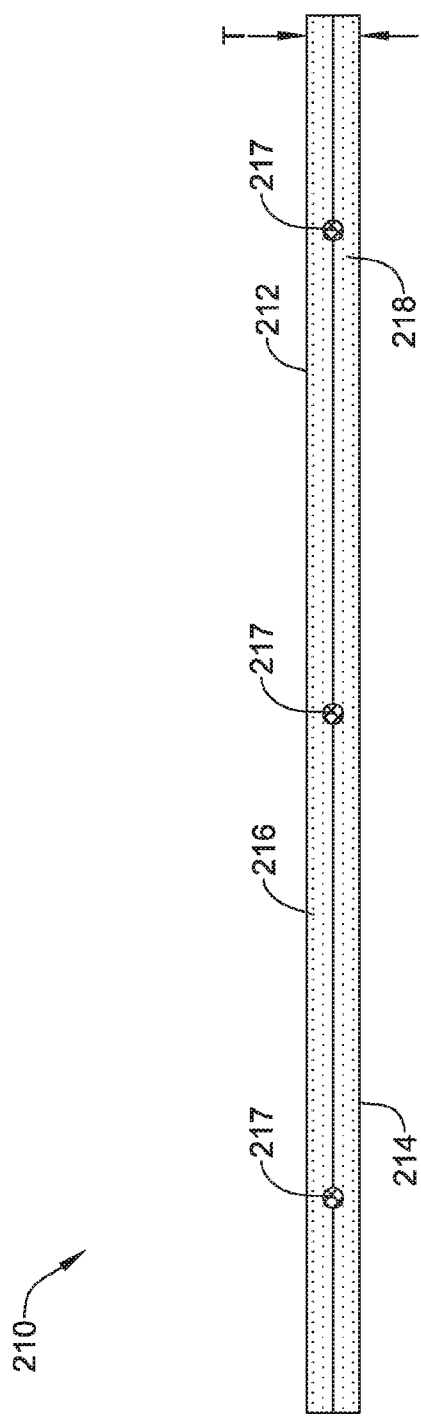
FIG. 21A is a cross-sectional view of the drink coaster of FIG. 21 taken along line 21A-21A.
Figure 22:
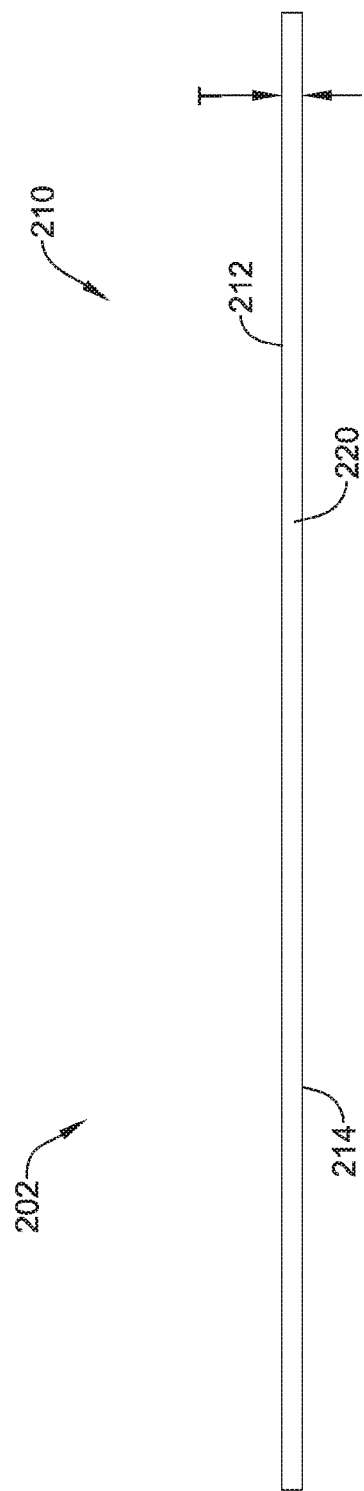
FIG. 22 is a side view of the drink coaster of FIG. 21.
Figure 23:
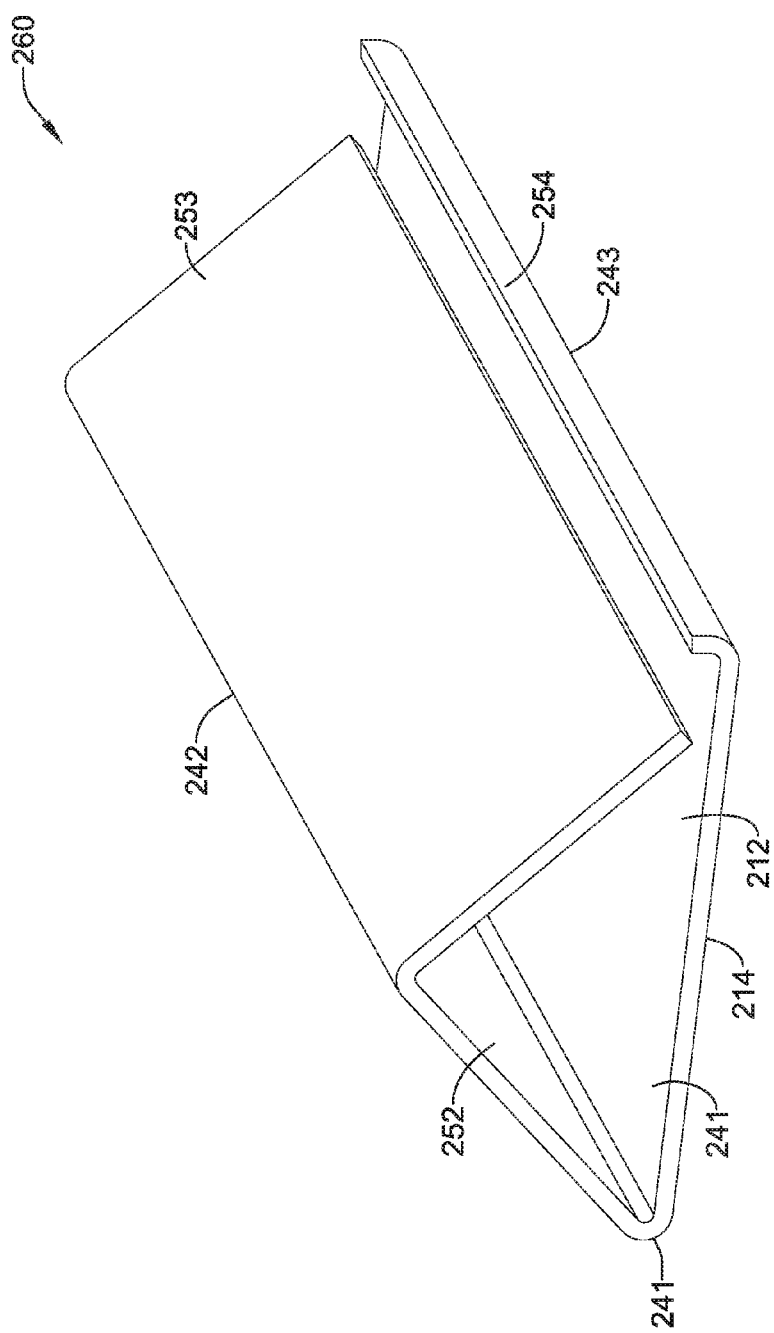
FIG. 23 is a perspective view of the drink coaster of FIG. 21 folded into a stand.
Figure 24:
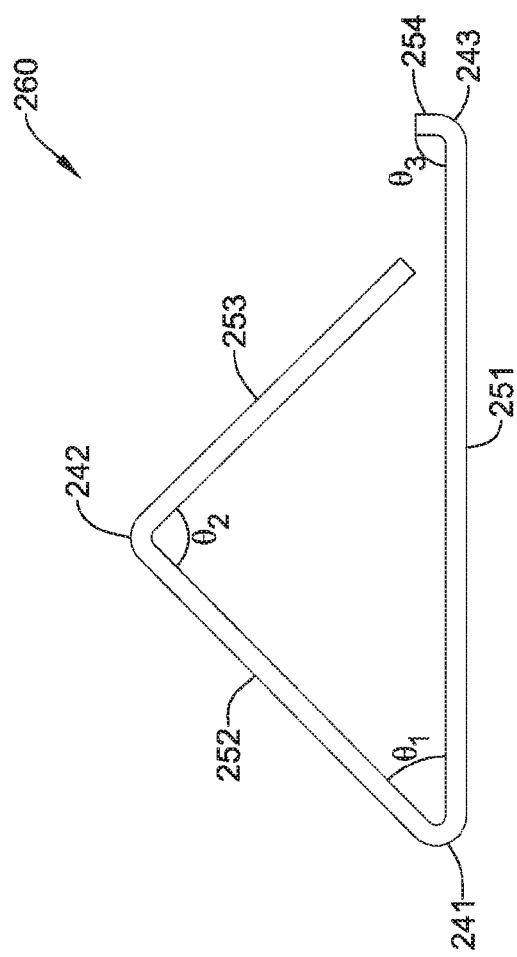
FIG. 24 is a left side view of the folded drink coaster of FIG. 23.
Figure 25:
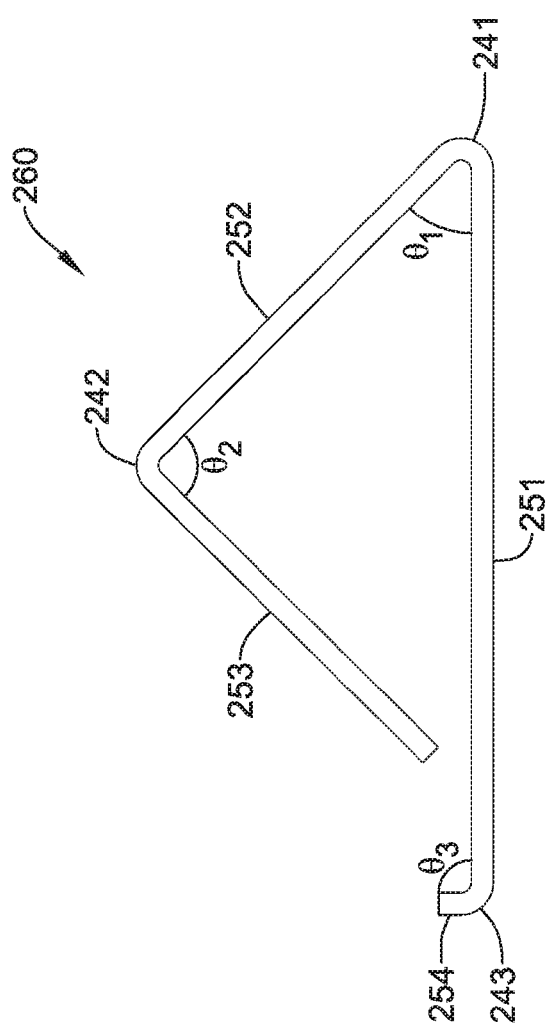
FIG. 25 is a right side view of the folded drink coaster of FIG. 23.
Figure 26:
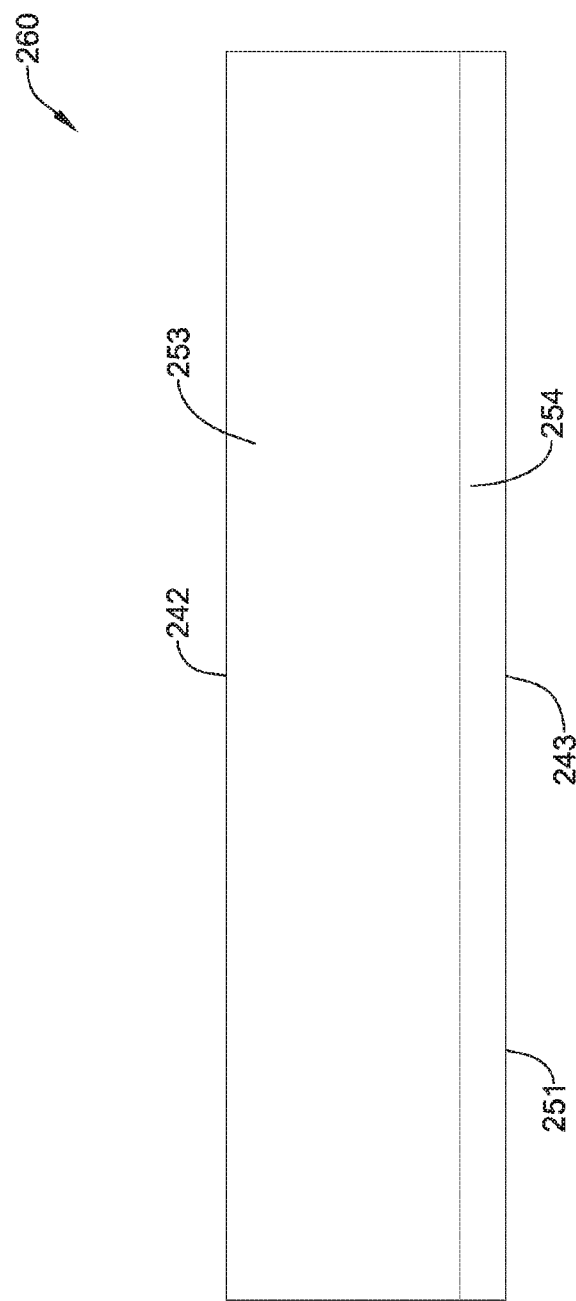
FIG. 26 is a front view of the folded drink coaster of FIG. 23.
Figure 27:
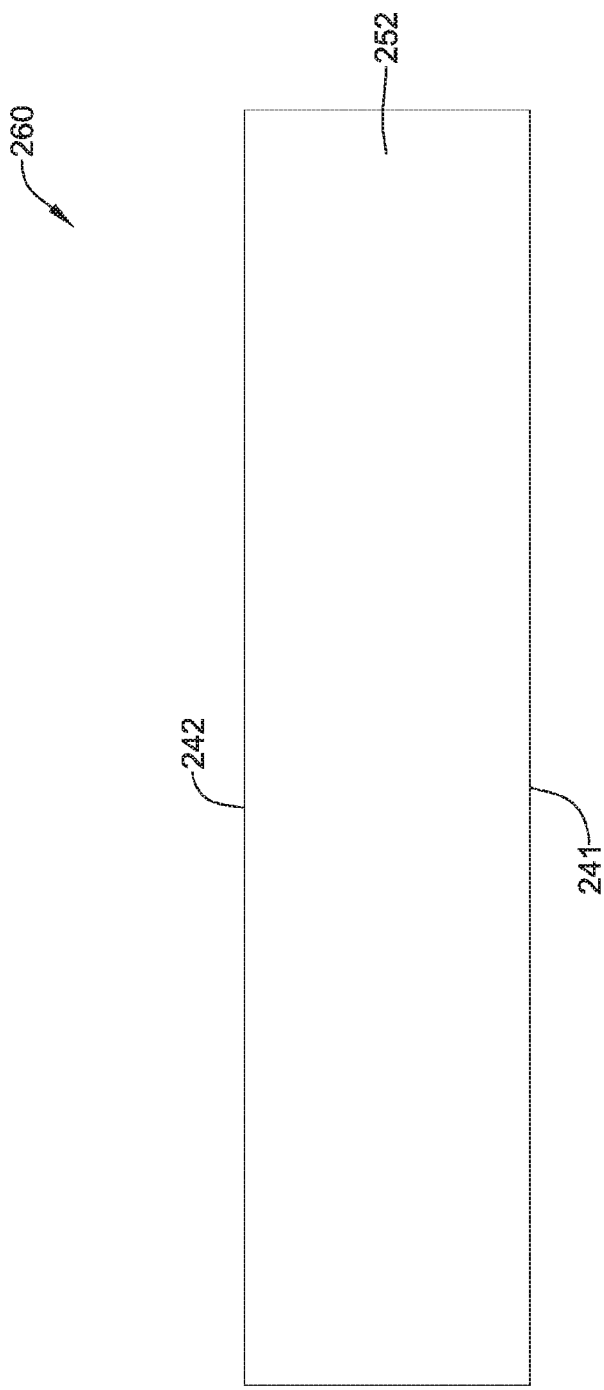
FIG. 27 is a rear view of the folded drink coaster of FIG. 23.
Figure 28:
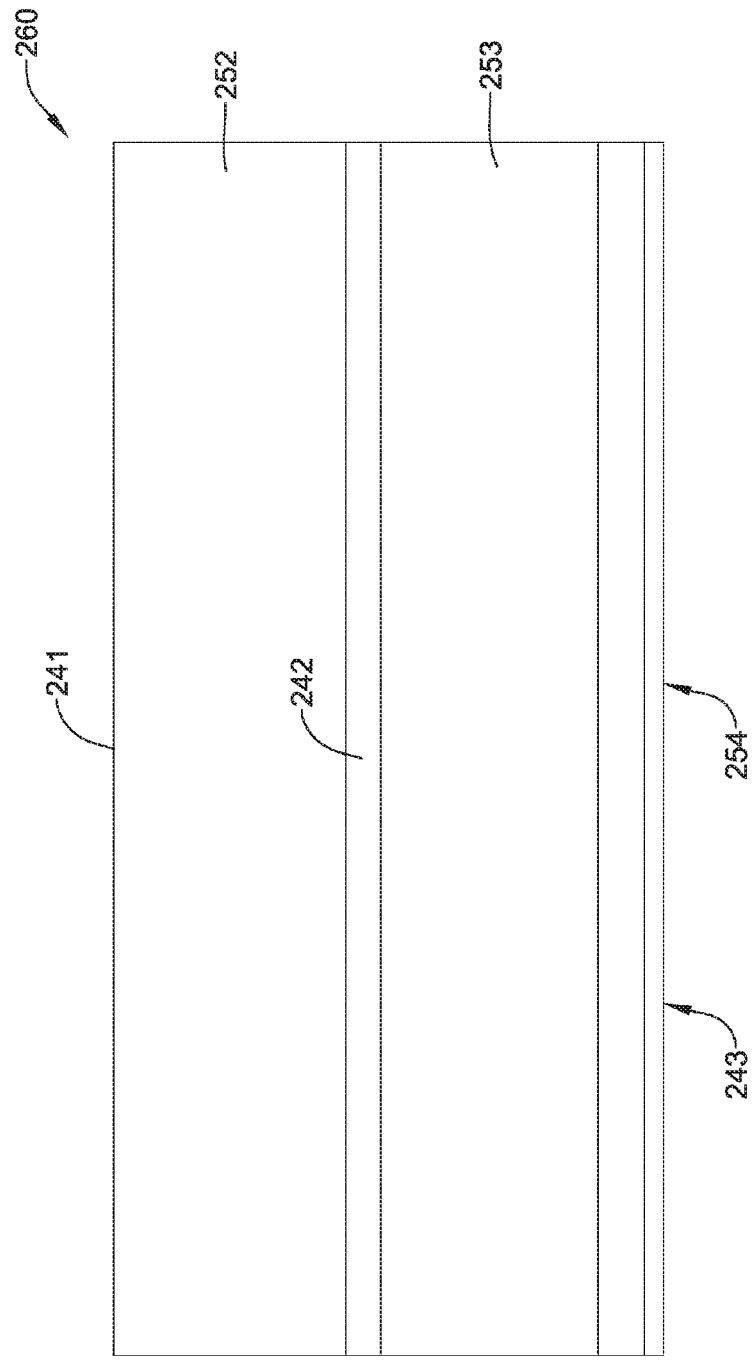
FIG. 28 is a top view of the folded drink coaster of FIG. 23.
Figure 29:
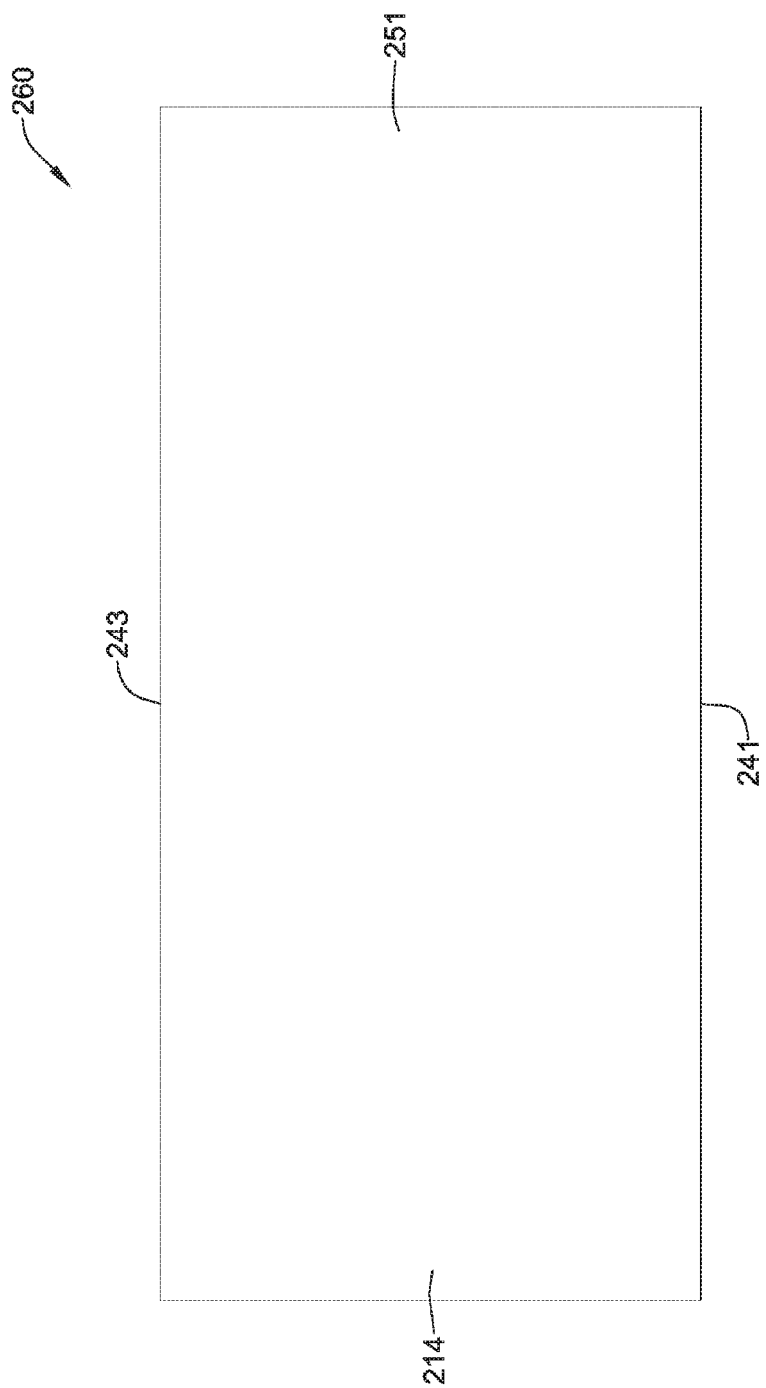
FIG. 29 is a bottom view of the folded drink coaster of FIG. 23.

Another exemplary drink coaster 202 is shown in FIGS. 21 and 22. In some instances, the drink coaster 202 may be intended to be disposable after a single use. The drink coaster 202 may include a flat sheet of material 210. In some instances the drink coaster 202 may consist of the flat sheet of material 210. The flat sheet of material 210, forming the drink coaster 202, may have an upper surface 212, an opposite lower surface 214, and a peripheral edge 220 extending around a periphery of the flat sheet of material 210. The peripheral edge 220 may extend from the upper surface 212 to the lower surface 214, and define a thickness T of the flat sheet of material 210. In some instances, the thickness T may be about 0.02 inches to about 0.06 inches, about 0.02 inches to about 0.04 inches, or about 0.03125 inches, for example. The lower surface 214 may be configured to face a flat surface, such as a table top, such that a beverage container (e.g., a cup, bottle, glass, can, etc.) can be placed on the upper surface 212.

The flat sheet of material 210 may be formed of any desired material, or combination of materials. For example, the flat sheet of material 210 may be formed, at least in part, from paperboard, such as cardboard, thick paper, laminated paper, etc. The flat sheet of material 210 may include one or more, or a plurality of layers of similar or dissimilar material. For instance, the flat sheet of material 210 may include one, two, three, four, five or more discrete layers of similar or dissimilar material. In some instances, the flat sheet of material 210 may include a single layer of material, such as paperboard material. In other instances, the flat sheet of material 210 may include multiple layers of similar or dissimilar materials. For instance, as shown in FIG. 21A, which is a cross-section of the drink coaster 202 taken along line 21A-21A of FIG. 21, the flat sheet of material 210 may include a first layer 216, which may be an upper layer defining the upper surface 212 in some instances, and a second layer 218, which may be a lower layer defining the lower surface 214 in some instances.

Also shown in FIG. 21A, the flat sheet of material 210 may also include one or more additional layers or discrete structures, which may, for instance, be interposed between the first, upper layer 216 and the second, lower layer 218. For example, the flat sheet of material 10 may include a plastically deformable layer or structure 217 (e.g., insert) interposed between the first layer 216 and the second layer 218, which may each be paperboard layers, for instance. The plastically deformable layer or structure 217 may be configured as a layer or structure that when bent by hand into a bent shape from its initial shape (e.g., flat) will substantially retain its bent shape without appreciably reverting to or toward its initial shape. Thus, when the flat sheet of material 210 of the coaster 202 is folded by a user from its flat configuration into a folded configuration, as described herein, the deformable layer or structure 217 is configured to retain the folded configuration such that the drink coaster 202 does not appreciably revert to or toward its flat configuration. In some instances the plastically deformable layer or structure 217 may be a malleable metal, such as a metallic foil, a metallic wire, or a metallic band or ribbon, for example. In some instances, the plastically deformable layer or structure 217 may be coextensive with the first and second layers 216, 218 (i.e., extend to the peripheral edge 220 at all points along the periphery). However, in other instances, the plastically deformable layer or structure 217 may only be positioned between a portion of the first and second layers 126, 218, for example. As shown in FIG. 21A, the plastically deformable layer or structure 217 may be one or more, or a plurality of wires extending across the flat sheet of material 210. The wires may extend generally perpendicular to the preferential fold lines 241, 242, 243, described herein. The wire(s) may have any desired cross-sectional shape. It is contemplated that the flat sheet of material 210, may, alternatively or additionally, include a different deformable layer or structure, such as those described herein.

The flat sheet of material 210 may have any cross-sectional shape when viewed toward the upper or lower surfaces 212, 214. For example, the flat sheet of material 210 may be generally square or round, although other shapes are contemplated. In saying the flat sheet of material is generally square, what is meant is that the flat sheet of material 210 may include four straight sides or edges with our without rounded corners between the straight sides or edges. For instance, as shown in FIG. 21, the peripheral edge 220 of the flat sheet of material 210 may include a first straight (e.g., planar) side or edge 221, a second straight (e.g., planar) side or edge 222, a third straight (e.g., planar) side or edge 223, and a fourth straight (e.g., planar) side or edge 224. The first straight side or edge 221 may be parallel to the second straight side or edge 222, and the third straight side or edge 223 may be parallel to the fourth straight side or edge 224. Furthermore, the first and second straight sides or edges 221, 222 may be perpendicular to the third and fourth straight sides or edges 223, 224. The length of each of the first, second, third and fourth sides or edges 221, 222, 223, 224 may be equal to one another. In instances, in which the flat sheet of material 210 includes one or more, or a plurality of rounded corners, the peripheral edge 220 may include a first rounded corner 230a, a second rounded corner 230b, a third rounded corner 230c, and/or a fourth rounded corner 230d. The first and third sides or edges 221, 223 may converge at the first rounded corner 230a, the second and fourth sides or edges 222, 224 may converge at the second rounded corner 230b, the second and third sides or edges 222, 223 may converge at the third rounded corner 230c, and/or the first and fourth sides or edges 221, 224 may converge at the fourth rounded corner 230d. The rounded corners 230a, 230b, 230c, 230d may have any desired radius. The generally square flat sheet of material 210 may include zero, one, two, three or four rounded corners, if desired. In other instances, the first and third sides or edges 221, 223 may converge at a first square corner, the second and fourth sides or edges 222, 224 may converge at a second square corner, the second and third sides or edges 222, 223 may converge at a third square corner, and/or the first and fourth sides or edges 221, 224 may converge at a fourth square corner. It is contemplated that the flat sheet of material 210 may include any combination of square and rounded corners, as desired.

The flat sheet of material 210 may include one or more, or a plurality of preferential fold lines for facilitating folding the drink coaster 202 into a stand for an item. The preferential fold line(s) may divide the flat sheet of material 210 into a plurality of panels which may be folded at an angle (at a perpendicular angle or oblique angle) to one another. For example, the flat sheet of material 210 may include a first preferential fold line 241, a second preferential fold line 242, and/or a third preferential fold line 243. In some instances, the first preferential fold line 241, the second preferential fold line 242, and/or the third preferential fold line 243 may be visible on the upper surface 212 and/or the lower surface 214. In some instances the first preferential fold line 241, the second preferential fold line 242, and/or the third preferential fold line 243 may be a perforation line, a score line, or other line or demarcation permitting the flat sheet of material 210 to be folded along the preferential fold line.

The first preferential fold line 241 may extend across the flat sheet of material 210 between a first panel 251 of the flat sheet of material 210 and a second panel 252 of the flat sheet of material 210. The second preferential fold line 242 may extend across the flat sheet of material 210 between the second panel 252 of the flat sheet of material 210 and a third panel 253 of the flat sheet of material 210. The third preferential fold line 243 may extend across the flat sheet of material 210 between the first panel 251 of the flat sheet of material 210 and a fourth panel 254 of the flat sheet of material 210. In some instances, the first preferential fold line 241 may extend parallel to the second preferential fold line 242 and/or the third preferential fold line 243.

The first panel 251 may be defined between the first preferential fold line 241 and the third preferential fold line 243 and extend between the third and fourth edges 223, 224. The second panel 252 may be defined between the first preferential fold line 241 and the second preferential fold line 242 and extend between the third and fourth edges 223, 224. The third panel 253 may be defined between the second preferential fold line 242 and the first edge 221 and extend between the third and fourth edges 223, 224. The fourth panel 254 may be defined between the third preferential fold line 243 and the second edge 222 and extend between the third and fourth edges 223, 224. Thus, the first panel 251 may be bounded, at least in part or entirely, by the first preferential fold line 241, the third preferential fold line 243, the third edge 223, and the fourth edge 224. The second panel 252 may be bounded, at least in part or entirely, by the first preferential fold line 241, the second preferential fold line 242, the third edge 223, and the fourth edge 224. The third panel 253 may be bounded, at least in part or entirely, by the second preferential fold line 242, the first edge 221, the third edge 223, and the fourth edge 224. The fourth panel 254 may be bounded, at least in part or entirely, by the third preferential fold line 243, the second edge 222, the third edge 223, and the fourth edge 224.

In instances in which the flat sheet of material 210 does not include the third preferential fold line 243, the first panel 251 may be defined between the first preferential fold line 241 and the second edge 222 and extend between the third and fourth edges 223, 224. Thus, the first panel 151 may be bounded, at least in part or entirely, by the first preferential fold line 141, the second edge 222, the third edge 223, and the fourth edge 224.

The first panel 251 may have a first surface area (e.g., the portion of the upper or lower surface 212, 214 occupied by the first panel), the second panel 252 may have a second surface area (e.g., the portion of the upper or lower surface 212, 214 occupied by the second panel), the third panel 253 may have a third surface area (e.g., the portion of the upper or lower surface 212, 214 occupied by the third panel), and the fourth panel 254 may have a fourth surface area (e.g., the portion of the upper or lower surface 212, 214 occupied by the fourth panel). In some instances, the surface area of the first panel 251 may be greater than the surface area of the second panel 252, the surface area of the second panel 252 may be greater than the surface area of the third panel 253, and the surface area of the third panel 253 may be greater than the surface area of the fourth panel 254.

In some instances, the first preferential fold line 241 may bisect, or substantially bisect the upper surface 212 and/or lower surface 214 of the flat sheet of material 210. For example, the first preferential fold line 241 may extend between the third and fourth edges 223, 224 through a center of the flat sheet of material 210. In describing the first preferential fold line 241 as substantially bisecting the upper surface 212, what is meant is that at least 40% of the surface area of the upper surface 212 is on each side of the first preferential fold line 241. In some instances, at least 45% of the surface area of the upper surface 212 is on each side of the first preferential fold line 241. It follows that in describing the first preferential fold line 241 as substantially bisecting the lower surface 214, what is meant is that at least 40% of the surface area of the lower surface 214 is on each side of the first preferential fold line 241. In some instances, at least 45% of the surface area of the lower surface 214 is on each side of the first preferential fold line 241.

The flat sheet of material 210 forming the drink coaster 202 may be configured to be folded from the flat configuration shown in FIGS. 21 and 22 to a folded configuration shown in FIGS. 23-29 to be used as a stand 260 for an item. For example, the stand 260 may be used to hold an electronic device, such as a smartphone, a tablet, or other electronic device in an elevated or propped position for better viewing of a screen of the device. The flat sheet of material 210 may be folded along one or more of the preferential fold lines, such as along the first preferential fold line 241, the second preferential fold line 242, and/or the third preferential fold line 243 to convert the drink coaster 202 into the folded configuration. For example, the second panel 252 may be folded relative to the first panel 251 along the first preferential fold line 241, the third panel 253 may be folded relative to the second panel 252 along the second preferential fold line 242, and/or the fourth panel 254 may be folded relative to the first panel 251 along the third preferential fold line 243.

In the folded configuration, the first panel 251 may be planar, the second panel 252 may be planar, the third panel 253 may be planar, and/or the fourth panel 254 may be planer. Each of the first, second, third, and fourth panels may be non-planar with each of the other panels in the folded configuration, wherein each of the first, second, third, and fourth panels may be coplanar in the flat configuration.

In the folded configuration, the first panel 251 may configured to be positioned on a flat surface, such as a table top with the lower surface 214 facing the flat surface. In the folded configuration, the second panel 252 may extend from the first preferential fold line 241 at an acute angle $\theta_1$ from the first panel 251 such that the second panel 252 is non-parallel to the first panel 251. In some instances, the acute angle $\theta_1$ may be about 25 degrees to about 60 degrees, about 30 degrees to about 50 degrees, about 30 degrees to about 45 degrees, about 45 degrees to about 60 degrees, about 40 degrees to about 50 degrees, or about 45 degrees for example. In the folded configuration, the third panel 253 may extend from the second preferential fold line 242 at an angle $\theta_2$ (e.g., a perpendicular or oblique angle) from the second panel 252 such that the third panel 253 is non-parallel to the second panel 252 and the first panel 251. In some instances, the angle $\theta_2$ may be about 70 degrees to about 110 degrees, about 75 degrees to about 105 degrees, about 80 degrees to about 100 degrees, about 85 degrees to about 95 degrees, about 85 degrees, about 90 degrees, or about 95 degrees for example. In the folded configuration, the fourth panel 254 may extend from the third preferential fold line 243 at an angle $\theta_3$ (e.g., a perpendicular or oblique angle) from the first panel 251 such that the fourth panel 254 is non-parallel to the first panel 251. In some instances, the angle $\theta_3$ may about 70 degrees to about 110 degrees, about 75 degrees to about 105 degrees, about 80 degrees to about 100 degrees, about 85 degrees to about 95 degrees, about 85 degrees, about 90 degrees, or about 95 degrees for example.

In the folded configuration, the stand 260 may be used for propping up an electronic device in an inclined position, similar to that shown in FIGS. 10 and 11. For example, the first panel 251 of the stand 260 may be positioned on a flat surface, such as a table top, with the lower surface 214 facing the flat surface. An edge of the electronic device may rest against the upper surface 212 of the first panel 251 while the rear surface of the electronic device may rest against the lower surface 214 of the third panel 253. The fourth panel 254, if present, may be juxtaposed with the edge of the electronic device and face a front of the electronic device. The fourth panel 254 may help prevent the electronic device from sliding with the electronic device in the inclined position without obstructing the view of the screen of the electronic device. In other instances, the upper surface 212 may include a coating or layer having a high coefficient of friction to prevent the electronic device from sliding with the electronic device in the inclined position.

Any one of the drink coasters 2, 102, 202, described above, may include indicia on the upper surface 12, 112, 212 and/or the lower surface 14, 114, 214 of the flat sheet of material 10, 110, 210. For example, the upper surface 12, 112, 212 and/or the lower surface 14, 114, 214 may include advertising, if desired. In some instances, the upper surface 12, 112, 212 and/or the lower surface 14, 114, 214 may additionally or alternatively include instructions for how to convert or fold the drink coaster 2, 102, 202 into a stand 60, 160, 260. For example, the upper surface 12, 112, 212 and/or the lower surface 14, 114, 214 may include one or more illustrations and/or text providing a user with directions as to how to fold the flat sheet of material 10, 110, 210 at the preferential fold lines to form a stand 60, 160, 260.

It should be understood that this disclosure is, in many respects, only illustrative. Changes may be made in details, particularly in matters of shape, size, and arrangement of steps without exceeding the scope of the disclosure. This may include, to the extent that it is appropriate, the use of any of the features of one example embodiment being used in other embodiments. The invention's scope is, of course, defined in the language in which the appended claims are expressed.

What is claimed is:

1. A drink coaster configured to be converted into a stand, the drink coaster comprising:
   a flat sheet of material having an upper surface, an opposite lower surface, and a peripheral edge extending around a periphery of the flat sheet of material and extending from the upper surface to the lower surface;
   a first preferential fold line extending across the flat sheet of material between a first panel of the flat sheet of material and a second panel of the flat sheet of material, the first preferential fold line extending from a first arcuate segment of the peripheral edge to a second arcuate segment of the peripheral edge;
   a second preferential fold line extending across the flat sheet of material between the second panel of the flat sheet of material and a third panel of the flat sheet of material;
   wherein the flat sheet of material is configured to be folded along the first preferential fold line such that the second panel extends at an acute angle from the first panel; and
   wherein the flat sheet of material is configured to be folded along the second preferential fold line such that the third panel extends at an angle from the second panel toward the first panel.

2. The drink coaster of claim 1, wherein the first preferential fold line extends parallel to the second preferential fold line.

3. The drink coaster of claim 1, wherein the first preferential fold line includes a score line or perforation extending along the lower surface of the flat sheet of material.

4. The drink coaster of claim 3, wherein the second preferential fold line includes a score line or perforation extending along the lower surface of the flat sheet of material.

5. The drink coaster of claim 1, wherein the peripheral edge of the flat sheet of material includes a first edge, a second edge parallel to the first edge, a third edge perpendicular to the first and second edges, and a fourth edge parallel to the third edge.

6. The drink coaster of claim 1, wherein the peripheral edge of the flat sheet of material includes first, second, third and fourth planar edges, wherein the first and third planar edges converge at a first rounded corner and the second and fourth planar edges converge at a second rounded corner.

7. The drink coaster of claim 6, wherein the first rounded corner includes the first arcuate segment and the second rounded corner includes the second arcuate segment such that the first preferential fold line extends from the first rounded corner to the second rounded corner.

8. The drink coaster of claim 1, wherein the peripheral edge of the flat sheet of material extends circumferentially around a center of the flat sheet such that the first and second arcuate segments are arranged along a circumference of the flat sheet.

9. The drink coaster of claim 1, wherein the first preferential fold line bisects one of the upper or lower surface.

10. The drink coaster of claim 1, wherein the first panel has a larger surface area than the second panel, and the second panel has a larger surface area than the third panel.

11. The drink coaster of claim 1, further comprising a third preferential fold line extending across the flat sheet of material between the first panel of the flat sheet of material and a fourth panel of the flat sheet of material.

12. The drink coaster of claim 11, wherein the first preferential fold line extends parallel to the second preferential fold line and the first preferential fold line extends parallel to the third preferential fold line.

13. The drink coaster of claim 11, wherein the first panel has a larger surface area than the second panel, the second panel has a larger surface area than the third panel, and the third panel has a larger surface are than the fourth panel.

14. The drink coater of claim 1, wherein the flat sheet of material includes a plastically deformable insert configured to retain a folded shape of the drink coaster.

15. The drink coaster of claim 14, wherein the plastically deformable insert is a metallic layer interposed between a first paperboard layer and a second paperboard layer of the flat sheet of material.

16. A drink coaster configured to be converted into a stand, the drink coaster comprising:
   a flat sheet of material having an upper surface, an opposite lower surface, and a peripheral edge extending around a periphery of the flat sheet of material and extending from the upper surface to the lower surface;
   a first preferential fold line extending across the flat sheet of material between a first panel of the flat sheet of material and a second panel of the flat sheet of material, the first preferential fold line extending from a first arcuate segment of the peripheral edge to a second arcuate segment of the peripheral edge;
   a second preferential fold line extending across the flat sheet of material between the second panel of the flat sheet of material and a third panel of the flat sheet of material;
   wherein the flat sheet of material is configured to be folded into a folded configuration for providing a stand;

wherein in the folded configuration the first panel is configured to be positioned on a flat surface, the second panel extends from the first preferential fold line at an acute angle from the first panel, and the third panel extends from the second preferential fold line at an angle from the second panel toward the first panel.

17. The drink coaster of claim 16, wherein the first preferential fold line extends parallel to the second preferential fold line.

18. The drink coaster of claim 16, further comprising:
a third preferential fold line extending across the flat sheet of material between the first panel of the flat sheet of material and a fourth panel of the flat sheet of material;
wherein in the folded configuration the fourth panel extends from the third preferential fold line at an acute angle from the first panel.

19. A disposable apparatus comprising:
a disposable drink coaster consisting of a flat sheet of paperboard material, the disposable drink coaster configured to be folded into a folded configuration for providing a stand;
the flat sheet of paperboard material including:
an upper surface, an opposite lower surface, and a peripheral edge extending around a periphery of the flat sheet of material and extending from the upper surface to the lower surface;
a first preferential fold line extending across the flat sheet of material between a first panel of the flat sheet of material and a second panel of the flat sheet of material;
a second preferential fold line extending across the flat sheet of material between the second panel of the flat sheet of material and a third panel of the flat sheet of material;
wherein in the folded configuration the first panel is configured to be positioned on a flat surface, the second panel extends from the first preferential fold line at an acute angle from the first panel, and the third panel extends from the second preferential fold line at an angle from the second panel toward the first panel.

20. The disposable apparatus of claim 19, wherein the first preferential fold line extends from a first arcuate segment of the peripheral edge to a second arcuate segment of the peripheral edge.

* * * * *